United States Patent
Wang et al.

(10) Patent No.: US 10,782,616 B2
(45) Date of Patent: Sep. 22, 2020

(54) AUTOMATIC SELECTION OF METROLOGY TARGET MEASUREMENT RECIPES

(71) Applicant: ASML NETHERLANDS B.V., Veldhoven (NL)

(72) Inventors: Daimian Wang, Fremont, CA (US); Shengrui Zhang, Shenzhen (CN); Chi-Hsiang Fan, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/325,767

(22) PCT Filed: Aug. 7, 2017

(86) PCT No.: PCT/EP2017/069969
§ 371 (c)(1),
(2) Date: Feb. 15, 2019

(87) PCT Pub. No.: WO2018/041550
PCT Pub. Date: Mar. 8, 2018

(65) Prior Publication Data
US 2019/0204750 A1    Jul. 4, 2019

Related U.S. Application Data

(60) Provisional application No. 62/382,771, filed on Sep. 1, 2016.

(51) Int. Cl.
*G06F 30/33* (2020.01)
*G03F 7/20* (2006.01)
*G03F 9/00* (2006.01)

(52) U.S. Cl.
CPC .......... *G03F 7/705* (2013.01); *G03F 7/70508* (2013.01); *G03F 7/70625* (2013.01);
(Continued)

(58) Field of Classification Search
CPC ..... H01L 22/12; H01L 22/10; H01L 27/0207; G03F 7/70633; G03F 7/705;
(Continued)

(56) References Cited

U.S. PATENT DOCUMENTS 5,969,441 A     10/1999  Loopstra et al.
2003/0003677 A1   1/2003  Fukada
(Continued)

FOREIGN PATENT DOCUMENTS

JP      2004119477      4/2004
TW      201527902       7/2015
(Continued)

OTHER PUBLICATIONS

International Search Report and Written Opinion issued in corresponding PCT Patent Application No. PCT/EP2017/069969, dated Nov. 15, 2017.
(Continued)

*Primary Examiner* — Binh C Tat
(74) *Attorney, Agent, or Firm* — Pillsbury Winthrop Shaw Pittaman LLP

(57) ABSTRACT

A method including performing a first simulation for each of a plurality of different metrology target measurement recipes using a first model, selecting a first group of metrology target measurement recipes from the plurality of metrology target measurement recipes, the first group of metrology target measurement recipes satisfying a first rule, performing a second simulation for each of the metrology target measurement recipes from the first group using a second model, and selecting a second group of metrology target measurement recipes from the first group, the second group of metrology target measurement recipes satisfying a second rule, the first
(Continued)

model being less accurate or faster than the second model and/or the first rule being less restrictive than the second rule.

20 Claims, 21 Drawing Sheets

(52) U.S. Cl.
CPC ...... *G03F 7/70633* (2013.01); *G03F 7/70683* (2013.01); *G03F 9/7046* (2013.01)

(58) Field of Classification Search
CPC ............. G03F 7/70625; G03F 7/70616; G03F 7/7065; G03F 7/70508; G03F 1/36; G03F 1/38; G03F 7/2002; G03F 7/70433; G03F 7/70441; G03F 9/7023; G03F 7/70358; G03F 7/7085; G03F 7/70866; G03F 9/7046; G03F 9/7076; G01N 21/8851; H04N 1/6033; H04N 9/09; G06F 30/30; G06F 30/398; G06F 17/18; G06F 2111/10; G06F 30/20; G06F 30/367; G06F 17/12; G06F 2119/22
USPC ..................................................... 716/50–56
See application file for complete search history.

(56) References Cited

U.S. PATENT DOCUMENTS

| | | |
|---|---|---|
| 2005/0188342 A1 | 8/2005 | Goodwin |
| 2005/0254030 A1 | 11/2005 | Tolsma et al. |
| 2008/0072207 A1* | 3/2008 | Verma ....................... G03F 1/84 716/52 |
| 2008/0250384 A1* | 10/2008 | Duffy .................. G03F 7/70525 716/55 |
| 2009/0157360 A1 | 6/2009 | Ye et al. |
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2015/0185626 A1* | 7/2015 | Chen ....................... G03F 7/705 355/52 |
| 2016/0042105 A1 | 2/2016 | Adel et al. |
| 2016/0117812 A1* | 4/2016 | Pandev ................. G06T 7/0004 382/149 |
| 2016/0161863 A1 | 6/2016 | Den Boef et al. |

FOREIGN PATENT DOCUMENTS

| | | |
|---|---|---|
| WO | 2009078708 | 6/2009 |
| WO | 2009106279 | 9/2009 |

OTHER PUBLICATIONS

Taiwanese Office Action issued in corresponding Taiwanese Patent Application No. 106128518, dated May 9, 2018.

* cited by examiner

AUTOMATIC SELECTION OF METROLOGY TARGET MEASUREMENT RECIPES

CROSS-REFERENCE TO RELATED APPLICATIONS

This application is the U.S. national phase entry of PCT patent application no. PCT/EP2017/069969, which was filed on Aug. 7, 2017, which claims the benefit of priority of U.S. provisional application No. 62/382,771, which was filed on Sep. 1, 2016, and which is incorporated herein in its entirety by reference.

FIELD

The description herein relates to lithographic apparatuses and processes, and more particularly to a tool and a method to inspect or measure objects produced by, or used, in a patterning process.

BACKGROUND

A lithographic apparatus can be used, for example, in the manufacture of integrated circuits (ICs) or other devices. In such a case, a patterning device (e.g., a mask) may contain or provide a pattern (e.g., a circuit pattern) corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various procedures such as etching, ion-implantation (doping), metallization, oxidation, chemo-mechanical polishing, etc., all intended to finish off the individual layer of the device. If several layers are required in the device, then some or all of these procedures or a variant thereof may be repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

During or after the patterning process, one or more measurements may be performed, e.g., to determine alignment error, overlay error, or a critical dimension of one or more of the patterns. To facilitate the measurements, a metrology target may be formed in one or more layers on the substrate. The selection of one or more desirable metrology targets may be performed manually from a potentially infinite pool of metrology target designs by trial and error, and/or by rule of thumb based on prior experience. For example, one may start with a metrology target design, perform a simulation with respect to the metrology target design, and decide whether the metrology target design is good enough based on prior experience. Then the process may be repeated with another metrology target design until one or more acceptable metrology target designs (for use as one or more metrology targets in the patterning process) are selected.

Unfortunately, such simulation can take a long time due to the computational complexity. Therefore, this selection process can be time consuming and even ineffective to evaluate all the metrology target designs in the pool, particularly when the number of metrology target designs in the pool is large. As a result, only a portion of the metrology target designs in the pool may be evaluated. As such, high quality metrology target designs may be missed. Additionally, the selection process may not be performed automatically. Rather, a judgmental call can be made on the initial pool of metrology target designs and/or on whether a metrology target design under evaluation is selected. As a result, different people may select different targets. The quality of the selection can depend on the prior experience of the person performing the selection such that, for example, the right metrology target designs may not be selected due to lack of experience. In some examples, someone that is highly experienced might need to be involved in the selection process to ensure selection quality. This can render the selection process inefficient. Therefore, there is a desire, for example, for a fast and automatic process for selecting one or more metrology target design for creating one or more metrology targets in the patterning process.

In an embodiment, there is provided a method comprising: performing, by a hardware computer, a first simulation for each of a plurality of different metrology target measurement recipes using a first model; selecting a first group of metrology target measurement recipes from the plurality of metrology target measurement recipes, the first group of metrology target measurement recipes satisfying a first rule; performing, by the computer, a second simulation for each of the metrology target measurement recipes from the first group using a second model; and selecting a second group of metrology target measurement recipes from the first group, the second group of metrology target measurement recipes satisfying a second rule, the first model being less accurate or faster than the second model and/or the first rule being less restrictive than the second rule.

In an embodiment, there is provided a computer program product comprising a non-transitory computer readable medium having instructions recorded thereon, the instructions when executed by a computer implementing a method herein.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting an apparatus, e.g., an inspection apparatus or lithographic apparatus, such that processes and/or results (e.g., of measurement using metrology or of device manufacturing using lithography) have one or more desirable characteristics, such as higher accuracy of measurement or of projection of a design layout on a substrate, higher measurement precision, larger process window, etc.

Before describing embodiments in detail, it is instructive to present an example environment in which embodiments may be implemented.

Figure 1A:
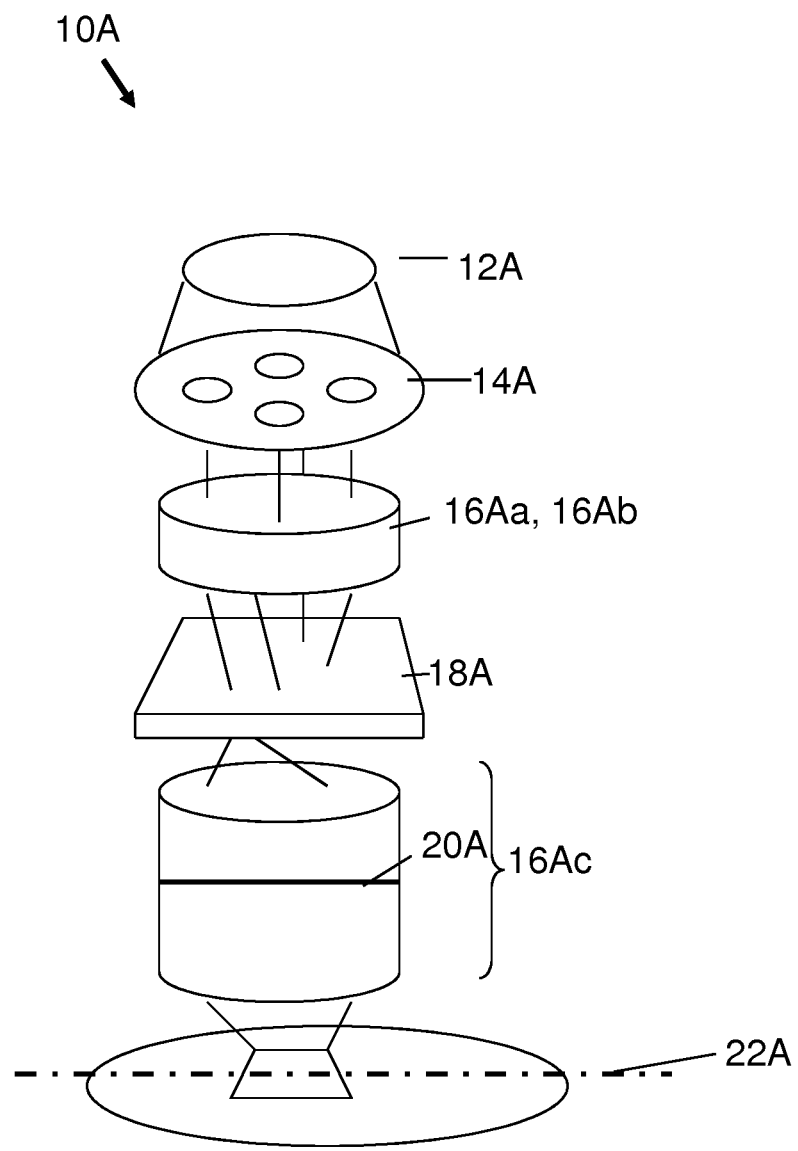
FIG. 1A is a block diagram of various subsystems of a lithography system.

FIG. 1A illustrates an exemplary lithographic apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In a lithographic apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. An illumination mathematical model can be used to derive the aerial image. A resist layer on the substrate is exposed and the aerial image is transferred to the resist layer as a latent "resist image" (RI) therein. The resist image (RI) can be defined as a spatial distribution of solubility of the resist in the resist layer. A resist mathematical model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic apparatus (e.g., properties of the source, the patterning device and the projection optics) dictate the aerial image as determined by the illumination model. Since the patterning device used in the lithographic apparatus can be changed, it is desirable to separate the optical properties of the patterning device from the optical properties of the rest of the lithographic apparatus including at least the source and the projection optics.

Figure 1B:
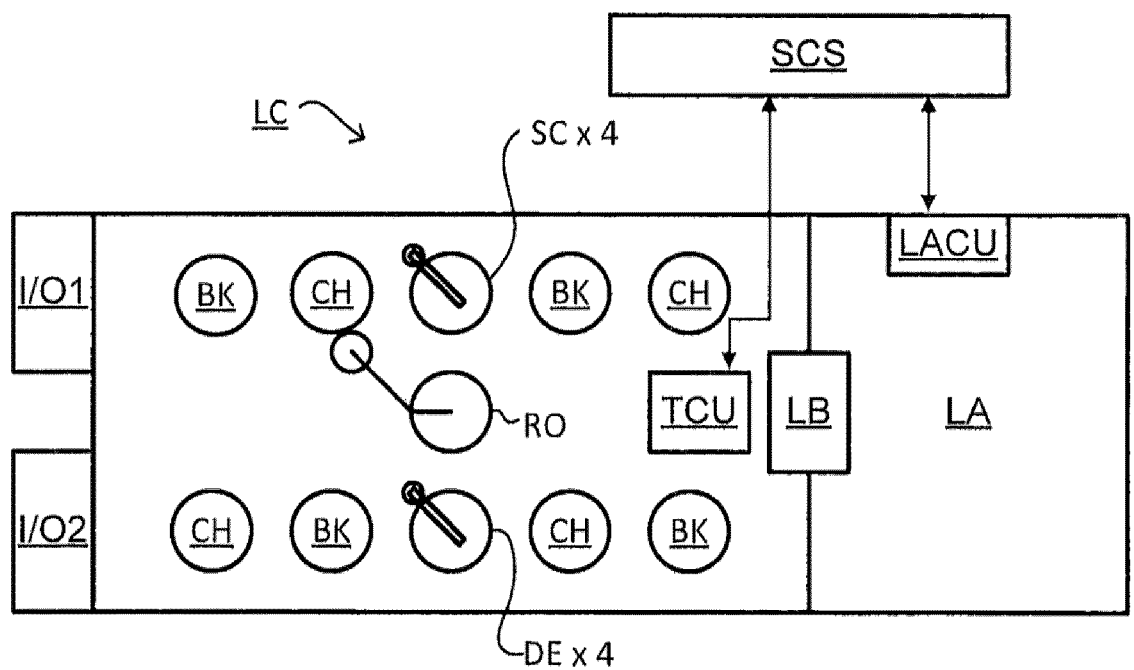
FIG. 1B schematically depicts an embodiment of a lithographic cell or cluster.

As shown in FIG. 1B, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device or inspection apparatus configured to measure a physical parameter of the substrate, such as a scatterometer, a scanning electron microscope, etc.

In device fabrication process (e.g., a lithographic process which comprises a lithography method and optionally one or more other methods such a resist coating, etching, development, etc.), a substrate and/or other structure may be subjected to various types of measurement during or after the process. The measurement may determine, for example, whether a particular substrate is defective, may establish adjustments to a method and/or apparatus used in the process (e.g., aligning two layers on a substrate or aligning the patterning device to the substrate), may measure the performance of a method in the process, of the process itself and/or an apparatus used in the process, or may be for other purposes. Examples of measurement include optical imaging (e.g., optical microscope), non-imaging optical measurement (e.g., measurement based on diffraction such as metrology using an ASML YieldStar tool and/or alignment measurement using an ASML SMASH GridAlign tool), mechanical measurement (e.g., profiling using a stylus, atomic force microscopy (AFM)), non-optical imaging (e.g., scanning electron microscopy (SEM)), etc. The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Figure 2A:
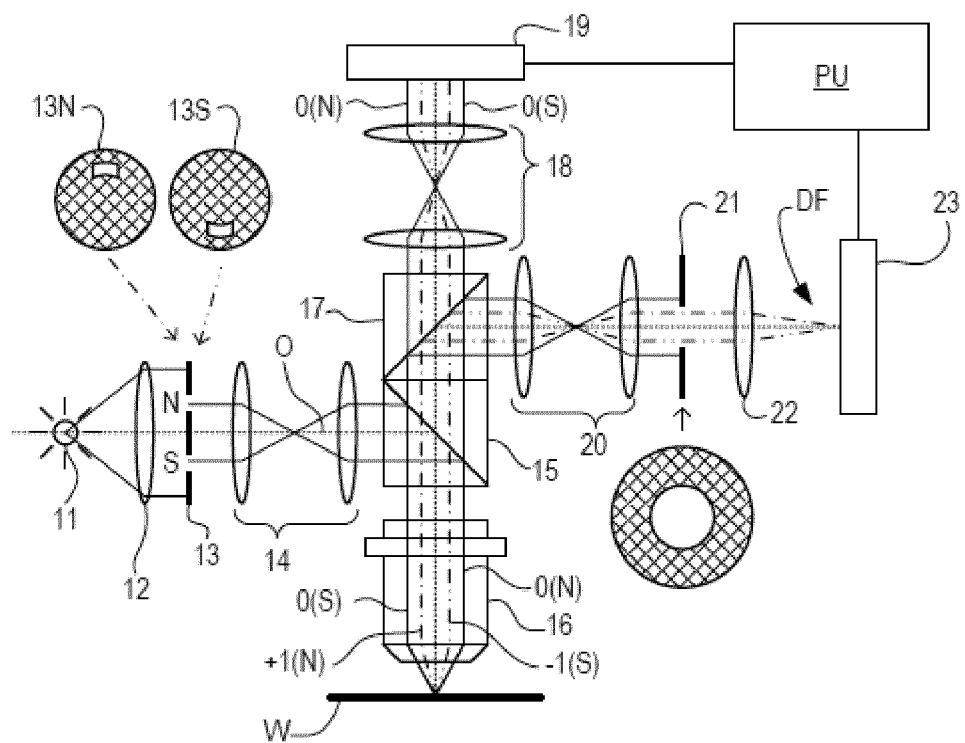
FIG. 2A schematically depicts an example inspection apparatus and metrology technique.

An embodiment of an inspection (e.g., metrology) apparatus is shown in FIG. 2A. A target T (comprising a periodic structure such as a grating) and diffracted rays are illustrated in more detail in FIG. 2B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides radiation redirected by the applicable physical object onto a detector.

In an embodiment, the lens arrangement allows for access of an intermediate pupil-plane for spatial-frequency filtering. Therefore, the angular range at which the radiation is incident on the object can be selected by defining a spatial intensity distribution in a plane that presents the spatial spectrum of the object plane, here referred to as a (conjugate) pupil plane. In particular, this can be done, for example, by inserting an aperture plate or device 13 of suitable form between lenses 12 and 14, in a plane which is a back-projected image of the objective lens pupil plane. In the example illustrated, aperture plate or device 13 is in the form of plates (or portions of a plate) having different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figure 2B:
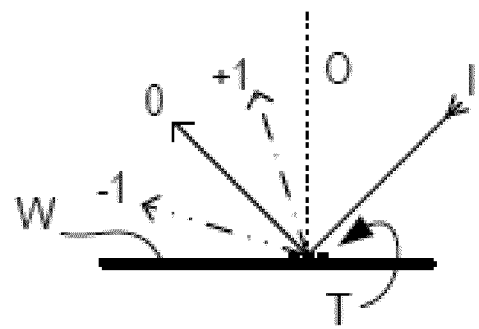
FIG. 2B is a schematic detail of a diffraction spectrum of a target for a given direction of illumination.

As shown in FIG. 2B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate W including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIG. 2A and FIG. 2B are shown somewhat off axis, purely to enable them to be more easily distinguished in the diagram.

At least the 0 and +1 orders diffracted by the target on substrate W are collected by objective lens 16 and directed back through prism 15. Returning to FIG. 2A, both the first and second illumination modes are illustrated, by designating diametrically opposite apertures labeled as north (N) and south (S). When the incident ray I is from the "north" side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1$^{st}$ and the +1$^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

Figure 2C:
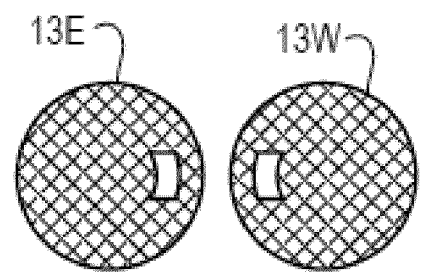
FIG. 2C is a schematic illustration of a pair of illumination apertures providing an illumination mode in using a measurement apparatus for, e.g., diffraction based overlay measurements.
Figure 2D:
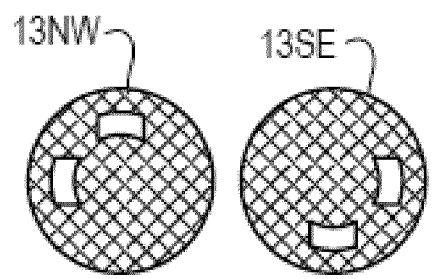
FIG. 2D is a schematic illustration of a pair of illumination apertures providing an illumination mode in using a measurement apparatus for, e.g., diffraction based overlay measurements.

The particular forms of aperture plate 13 and stop 21 shown in FIGS. 2A, 2C and 2D are purely examples. In another embodiment of the invention, on-axis illumination of the targets is used and an aperture stop with an off-axis aperture is used to pass substantially only one first order of diffracted radiation to the sensor. In yet other embodiments, 2nd, 3rd and higher order beams (not shown) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIG. 2C and FIG. 2D. FIG. 2C illustrates two further types of off-axis illumination mode. In a first illumination mode of FIG. 2C, aperture plate 13E provides off-axis illumination from a direction designated, for the sake of description only, as 'east' relative to the 'north' previously described. In a second illumination mode of FIG. 2D, aperture plate 13W is used to provide similar illumination, but from an opposite direction, labeled 'west'. FIG. 2D illustrates two further types of off-axis illumination mode. In a first illumination mode of FIG. 2D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 2E:
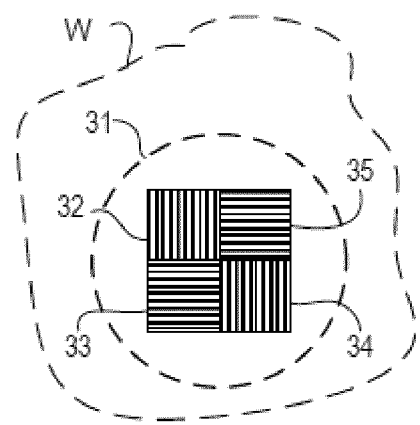
FIG. 2E depicts a form of multiple periodic structure (e.g., multiple grating) target and an outline of a measurement spot on an object.

FIG. 2E depicts an example composite metrology target formed on a physical object. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, e.g., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the object would be used to measure one pair of layers and all the periodic structures for another same target on the object would be used to measure another pair of layers, wherein the different bias facilitates distinguishing between the layer pairs.

Figure 2F:
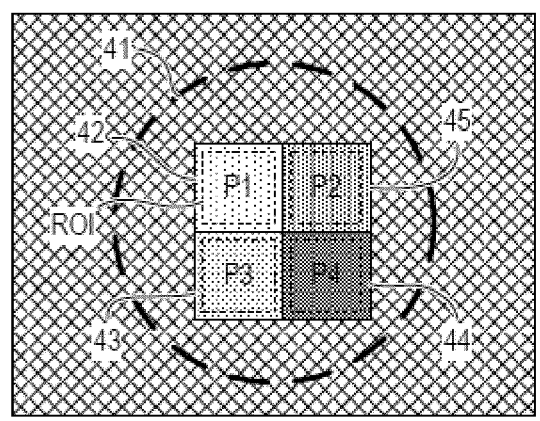
FIG. 2F depicts an image of the target of FIG. 2E obtained using, for example, the apparatus of FIG. 2A.

FIG. 2F shows an example of an image that may be formed on and detected by the sensor 23, using the target of FIG. 2E in the apparatus of FIG. 2A, using the aperture plates 13NW or 13SE from FIG. 2D. While the sensor 19 cannot resolve the different individual periodic structures 32 to 35, the sensor 23 can do so. The dark rectangle represents the field of the image on the sensor, within which the illuminated spot 31 on the object is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

A target may comprise a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target may be reduced, e.g., to 20 μm by 20 μm or less, or to 10 μm by 10 μm or less. In this situation, the periodic structure layout may be made smaller than the measurement spot (i.e., the periodic structure layout is overfilled). Such a target may be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011/0027704, US2011/0043791 and US2012/0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate W. In an embodiment, multiple targets can be measured in one image.

In an embodiment, the target may comprise one or more 1-D periodic gratings on a physical object, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the object. The pattern of the grating is sensitive to chromatic aberrations in the lithographic projection apparatus, particularly the projection system PS, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to a reconstruction process, performed by processing unit PU, from knowledge of the printing step and/or other measurement processes.

Thus, to enable such measurement, a metrology target should be used that has a particular metrology target pattern design and be measured using one or more specific parameters of the measurement itself. Accordingly, there can be provided a metrology target measurement recipe. In an embodiment, the metrology target measurement recipe can merely specify one or more parameters of the metrology target pattern design (where, for example, the one or more parameters of the measurement itself such as measurement beam wavelength, measurement beam polarization, etc. are fixed). That is, it can specify, e.g., the width of features of a periodic structure of the metrology target design, the pitch of the features of the periodic structure, etc. In an embodiment, the metrology target measurement recipe can merely specify one or more parameters of the metrology target measurement itself (where, for example, the one or more parameters of the metrology target pattern design itself such as the width of features of a periodic structure of the metrology target design, the pitch of the features of the periodic structure, etc. are fixed). That is, it can specify, e.g., the wavelength of the measurement beam, measurement beam polarization, etc. In an embodiment, the metrology target measurement recipe can specify one or more parameters of the metrology target pattern design and one or more parameters of the metrology target measurement itself so as to obtain a combination of a measurement recipe and target design.

The term "metrology target measurement recipe" may include one or more parameters of the measurement itself, one or more parameters of one or more metrology target pattern designs, or both. For example, if the measurement used in a metrology target measurement recipe is a diffraction-based optical measurement using a radiation beam, one or more of the parameters of the measurement may include the wavelength of the measurement radiation beam, the polarization of the measurement radiation beam, the incident angle of the measurement radiation beam relative to the object on which the metrology target is formed, the orientation of the measurement radiation beam relative to a pattern on an object, etc. One or more metrology targets or metrology target structures are formed on the applicable physical object (e.g., substrate W) based on the metrology target pattern design (also referred to herein as "nominal metrology target design") through one or more patterning processes (e.g., lithography, etching, etc.). In an embodiment, the one or more metrology targets may be specially used for measurement purposes. In an embodiment, the one or more metrology targets may be part of the pattern for a functional device. Multiple copies of a metrology target may be placed on many places on an object. The one or more parameters of the one or more metrology target pattern designs may include the shape of a periodic structure, or a part thereof, of the metrology target pattern design, the orientation of a periodic structure, or a part thereof, of the metrology target pattern design, a materials property (e.g., the refractive index of the material, the extinction coefficient of the material, etc.) of material used to form the metrology target according to the metrology target pattern design, a length of a periodic structure, or a feature thereof, of the metrology target pattern design, a width of a periodic structure, or a feature thereof, of the metrology target pattern design, and/or the thickness of a metrology target formed according to the metrology target pattern design. A metrology target measurement recipe may be used to align, or measure alignment of, a layer of a pattern being imaged against an existing pattern on a substrate (e.g., overlay). A metrology target measurement recipe may be used to determine alignment between two objects, such as alignment between a patterning device and a resist-coated substrate or between a resist-coated substrate and a substrate table, by respectively measuring the relative position between the patterning device and the resist-coated substrate or the relative position between the resist-coated substrate and the substrate table. As used herein, a physical object onto which a metrology target is provided according to a metrology target measurement recipe is not limited to a substrate onto which a device is, or is being, formed. The object can be any kind of object, including a substrate table, a patterning device, etc.

A metrology target measurement recipe may thus be expressed in a mathematical form: $(r_1, r_2, r_3, \ldots r_m; t_1, t_2, t_3, \ldots t_n)$, where $r_i$ are parameters of the measurement itself, $t_j$ are parameters of the one or more nominal metrology target designs, m and/or n are positive integers. As noted above, the metrology target measurement recipe can comprise merely one or more parameters $r_i$ of the measurement itself. Or, in an embodiment, the metrology target measurement recipe can comprise merely one or more parameters $t_j$ of the one or more nominal metrology target designs. Or, advantageously, the metrology target measurement recipe includes one or more parameters of both types. The metrology target measurement recipe will typically comprise a plurality of parameters selected from the one or more parameters of the measurement itself and/or one or more parameters of the one or more nominal metrology target designs. For example, the measurement recipe may have a parameter of the measurement itself and a plurality of parameters of the one or more nominal metrology target designs or a plurality of parameter of the measurement itself and a plurality of parameters of the one or more nominal metrology target designs.

In order to obtain useful data, a metrology target measurement recipe should be both sufficiently accurate and precise. Accuracy and precision are related but distinct concepts. The accuracy of a measurement of a quantity is the degree of closeness of the measured value of the quantity to the true value of the quantity. The precision of a measurement, related to reproducibility and repeatability, is the degree to which repeated measurements of a quantity under unchanged conditions show the same results. Although the two terms precision and accuracy can be synonymous in colloquial use, they are deliberately contrasted in the context of the scientific method and in this disclosure. A measurement can be accurate but not precise, precise but not accurate, neither, or both. For example, if a measurement contains a systematic error, then increasing the sample size (i.e., number of repetitions) generally increases precision but does not improve accuracy. Eliminating systematic error improves accuracy but does not change precision.

So, to ascertain the precision of a measurement does not necessarily require knowledge of the true value of the quantity measured. The precision of a measurement of a quantity may be limited by the nature of the measurement, the apparatus used for the measurement, the environment, or even the physics involved in the measurement. However, to ascertain the accuracy of a measurement may be difficult without knowing the true value of the quantity measured.

Figure 3:
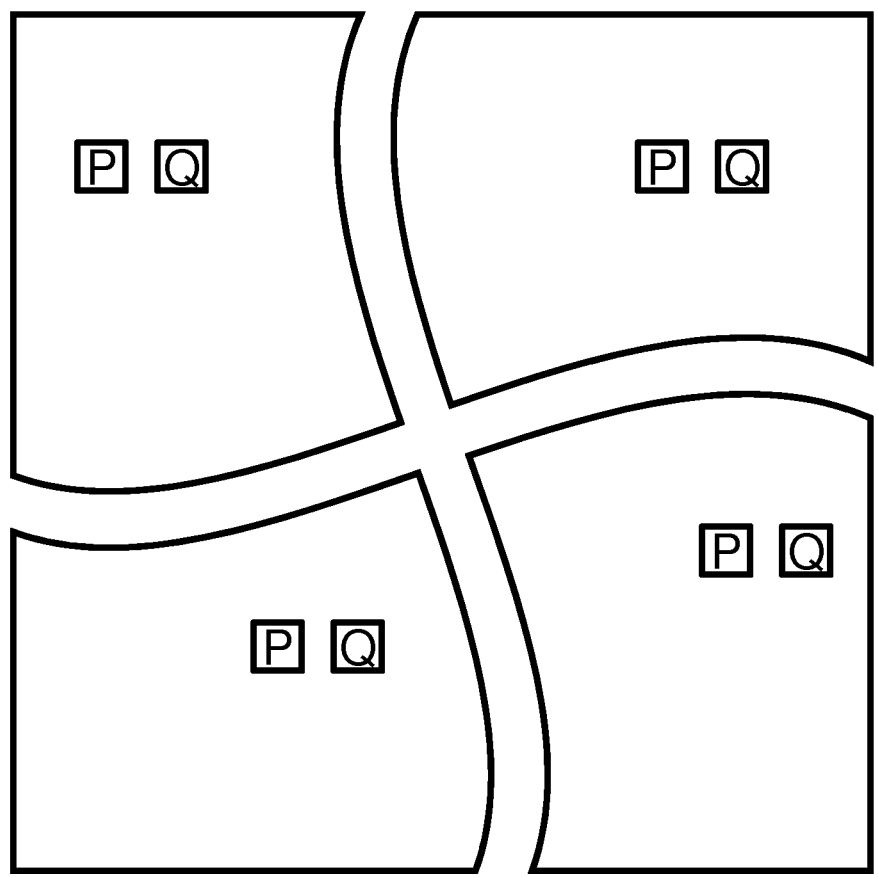
FIG. 3 schematically shows an object with two distinct targets P and Q, where copies of each are placed in four different areas of the object.

As described above, multiple copies of the metrology targets may be placed in difference places of a physical object (e.g., substrate W). FIG. 3 schematically shows an object with two distinct metrology targets P and Q, where copies of each are placed in four different areas of the object. The metrology targets may include a periodic structure, such as one or more gratings, e.g., a plurality of gratings, which may have one or more gratings of mutually perpendicular directions. The object of FIG. 3 may be subjected to measurement using two metrology target measurement recipes A and B. In this case, the metrology target measurement recipes A and B at least differ in one parameter, namely the metrology target measured (e.g., A measures the metrology target P and B measures the metrology target Q). In an embodiment, the metrology target measurement recipes A and B may also differ on one or more parameters of the measurement itself of the respective targets. Metrology target measurement recipes A and B may not even be based on the same measurement technique. For example, metrology target measurement recipe A may be based on SEM measurement and metrology target measurement recipe B may be based on AFM measurement.

A desirable metrology target measurement recipe may result in a nominal metrology target design represented by the metrology target measurement recipe with a high degree of printability, result in a metrology target with a high degree of detectability, result in measurement of a metrology target with a high degree of robustness, result in a metrology target design with a high degree of similarity to features of a pattern of a functional device, etc.

The printability is the degree of closeness between the nominal metrology target design and the metrology target formed on the object. For example, a high degree of printability may indicate that the metrology target formed on the object is substantially similar to the nominal metrology target design. On the other hand, a low degree of printability may indicate that the metrology target formed on the object is substantially different from the nominal metrology target design. The printability of the nominal metrology target design may be affected by one or more physical and/or chemical effects during the patterning process. These effects may impact different nominal metrology target designs differently, which may be represented by different values of the one or more parameters $t_j$ in different metrology target measurement recipes. Namely given a similar patterning process, some metrology target measurement recipes (namely the selection of the one or more parameters of the metrology target pattern design itself) may result in metrology targets formed on the object with greater patterning errors than others. One example of a printability indicator that characterizes the printability of the nominal metrology target may be indicative of a difference between the metrology target formed on the object and the nominal metrology target design. So, in an embodiment, a smaller printability indicator can indicate a high degree of printability, and a larger printability indicator can indicate a low degree of printability.

The detectability indicates the degree to which the metrology target formed on the object based on the nominal metrology target design can be detected by a metrology tool and yield proper measurement results. In an embodiment, the detectability indicates whether the strength or intensity of radiation redirected (e.g., diffracted and/or reflected) by a metrology target is large enough to be detected and used to determine metrology data. For example, a high degree of detectability may indicate that a signal measured (e.g., intensity of the radiation redirected) from the metrology target is large enough to be detected and used to determine metrology data. On the other hand, for example, a low degree of detectability may indicate that a signal measured (e.g., intensity of the radiation redirected) from the metrology target is too small to be detected and used to determine metrology data. The metrology data may be calculated or obtained directly based on the detected signal. The metrology data may be an overlay error, an alignment, a critical dimension, or any other suitable metrology data. One example of a detectability indicator that characterizes the degree of detectability may be a ratio of the strength or intensity of the radiation redirected by the metrology target to a threshold intensity. As such, a larger detectability indicator can indicate a high degree of detectability, and a smaller detectability indicator can indicate a low degree of detectability.

The robustness of a measurement of a metrology target is the sensitivity of metrology data relative to perturbations of one or more parameters of the metrology target measurement recipe or of one or more other parameters of the patterning process (which can include one or more parameters of the metrology target fabrication and/or one or more parameters of the measurement process). For example, the one or more parameters may be the one or more parameters of the measurement, $r_i$, the one or more parameters of the nominal metrology target design, $t_j$, or both. For example, a high degree of robustness of the measurement may indicate a small variation of the metrology data responsive to an offset applied to the one or more parameters of the metrology target measurement recipe. On the other hand, for example, a low degree of robustness of the measurement may indicate a large variation of the metrology data responsive to an offset applied to the one or more parameters of the metrology target measurement recipe. One example of a robustness indicator that characterizes the robustness of the measurement with respect to the one or more parameters of the metrology target measurement recipe is a weighted combination of the derivative of the metrology data (e.g., overlay error, alignment, critical dimension (CD), etc.) with respect to each of the parameters of the one or more parameters of the metrology target measurement recipe. For example, a large robustness indicator may indicate that perturbations of the one or more parameters of the metrology target measurement recipe cause drastic change in the metrology data (and so the measurement result (i.e., the metrology data) using the metrology target measurement recipe may not be credible). So, for example, a small robustness indicator can indicate a high degree of robustness and a large robustness indicator can indicate a low degree of robustness.

The similarity of a metrology target to features of a functional device is the degree of closeness between a characteristic value of one or more features of the functional device and metrology data of a metrology target measured using a metrology target measurement recipe. In an embodiment, the metrology data is simulated. In an embodiment, the metrology data is measured. The characteristic value of the features of the functional device may be overlay error, alignment, or critical dimension. For example, a high degree of similarity to the features of the functional device may indicate that the measured overlay error, alignment, critical dimension, etc. of the metrology target using the metrology target measurement recipe is close to or equal to the overlay error, alignment, critical dimension, etc. of a feature of the functional device. On the other hand, a low degree of similarity may indicate that the measured overlay error, alignment, critical dimension, etc. of the metrology target using the metrology target measurement recipe is relatively far from the overlay error, alignment, critical dimension, etc. of a feature of the functional device. One example of a similarity indicator that characterizes the degree of similarity of the metrology target to features of a functional device is a difference between the metrology data and the characteristic value. So, for example, a smaller similarity indicator can indicate a high degree of similarity of the metrology target to a feature of a functional device, and a larger similarity indicator can indicate a low degree of similarity of the metrology target to a feature of a functional device.

In an embodiment, examples of performance indicators include target coefficient (TC), stack sensitivity (SS), overlay impact (OV), or the like. Stack sensitivity can be understood as a measurement of how much the intensity of the signal changes as overlay changes because of diffraction between target (e.g., grating) layers. It is thus an example measure of robustness or sensitivity of the measurement. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Thus, target coefficient is an example measure of detectability. Overlay impact measures the change in overlay error as a function of target design. Thus, overlay impact is an example measure of robustness or sensitivity.

Figure 4A:
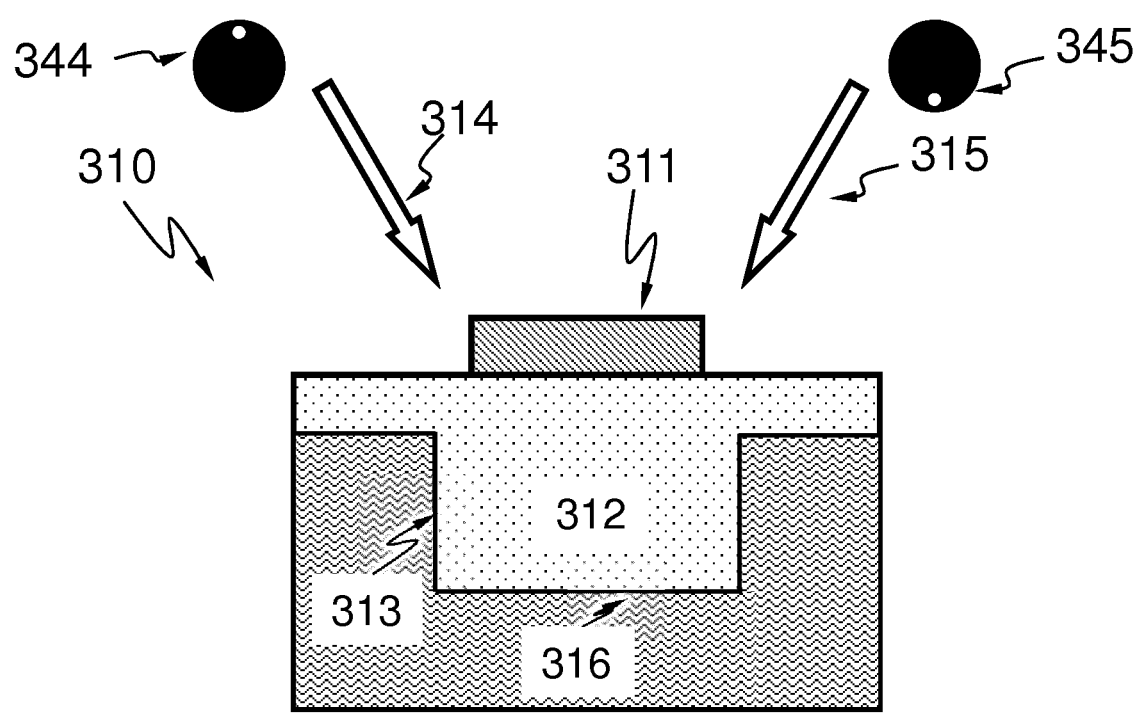
FIG. 4A shows an example of a nominal metrology target represented by a metrology target measurement recipe.

FIG. 4A is an example of a metrology target formed according to a nominal metrology target design represented by a metrology target measurement recipe and that is substantially similar to that nominal metrology target design. Specifically, FIG. 4A schematically shows a cross-section view of the stack of a metrology target 310 including an upper structure 311 over a trench 312. When the metrology target design has a high degree of printability, the metrology target 310 formed on the object may be substantially similar to the nominal metrology target design. Due to the symmetry of the metrology target 310, a same measurement of the overlay between the upper structure 311 and the trench 312 may be obtained using two otherwise identical metrology target measurement recipes which respectively use radiation beams 314 and 315 at the same incidence angle for metrology target measurement, except that the radiation beams 314 and 315 are directed from different directions (i.e., different azimuth angles) onto the object. The radiation beams 314 and 315 may be generated by using aperture plates 334 and 335 respectively at the pupil plane (e.g., the aperture plate 13 in FIG. 2A). Due to the high degree of printability, the metrology target measurement recipe that represents the metrology target 310 should be kept for further use. However, a practical patterning process may affect printability of the metrology target (e.g., 310) when formed according to the nominal metrology target design represented by a metrology target measurement recipe. If so, such metrology target measurement recipe may be discarded given the specific patterning process.

Figure 4B:
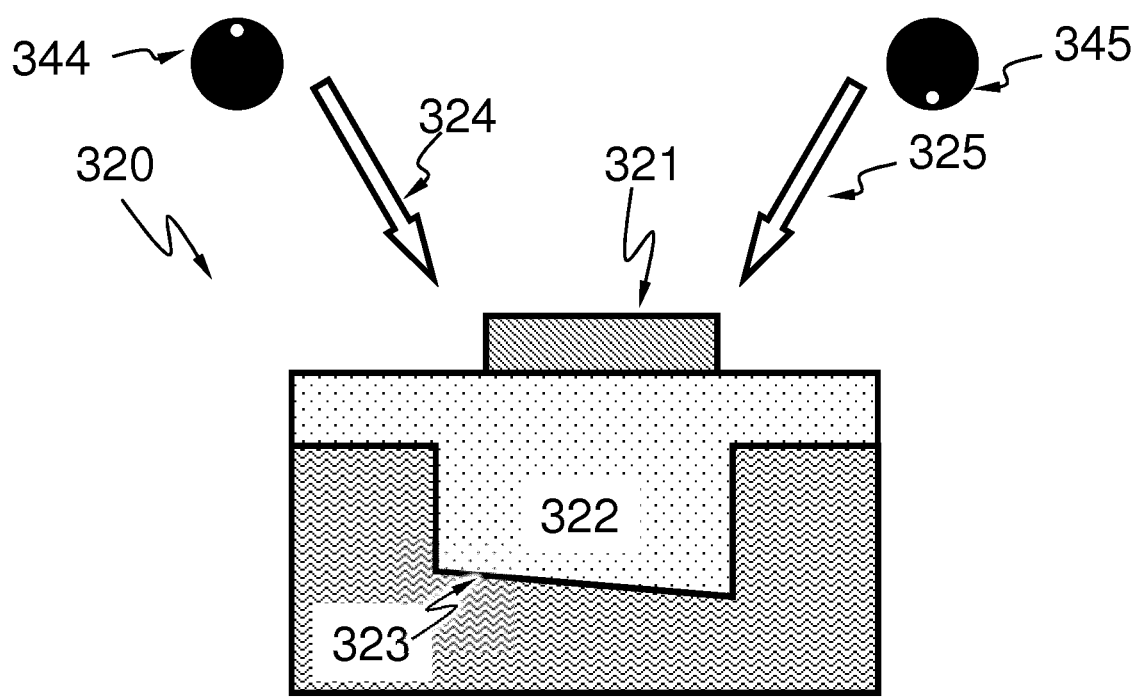
FIGS. 4B-4C demonstrate that a patterning process may affect printability of a nominal metrology target represented by a metrology target measurement recipe.

FIG. 4B schematically shows a cross-sectional view of the stack of a metrology target 320 formed according to a nominal metrology target design represented by a metrology target measurement recipe. The metrology target 320 includes an upper structure 321 over a trench 322. As shown in FIG. 4B, the metrology target 320 is substantially different from the metrology target 310. For example, the bottom 323 of the trench 322 is tilted (not parallel to the object) because of the process (e.g., etch, chemical-mechanical polish (CMP), or one or more other steps in the process). This can indicate that the metrology target design has a low degree of printability as shown in FIG. 4B. As a result, the metrology target measurement recipe that represents the metrology target should perhaps be discarded. Otherwise, metrology data from metrology target 320 may be unreliable and inaccurate if the metrology target measurement recipe is used. For example, two otherwise identical metrology target measurement recipes that respectively use radiation beams 324 and 325 at the same incidence angle for metrology target measurement, except that the radiation beams 324 and 325 are directed from different directions (i.e., different azimuth angles) onto the target. The radiation beams 324 and 325 may be generated by using aperture plates 344 and 345 respectively at the pupil plane (e.g., the aperture plate 13 in FIG. 2A). Although the beams 324 and 325 have the same angle of incidence relative to the target, they do not have the same angle of incidence relative to the bottom 323 of the trench 322 because the bottom 323 is tilted relative to the object in which the metrology target is formed. Therefore, characteristics of the scattering of the beams 324 and 325 by the target are different and a systematic error caused by the tilted bottom 323 is different for metrology target measurement recipes respectively using the beams 324 and 325.

Figure 4C:
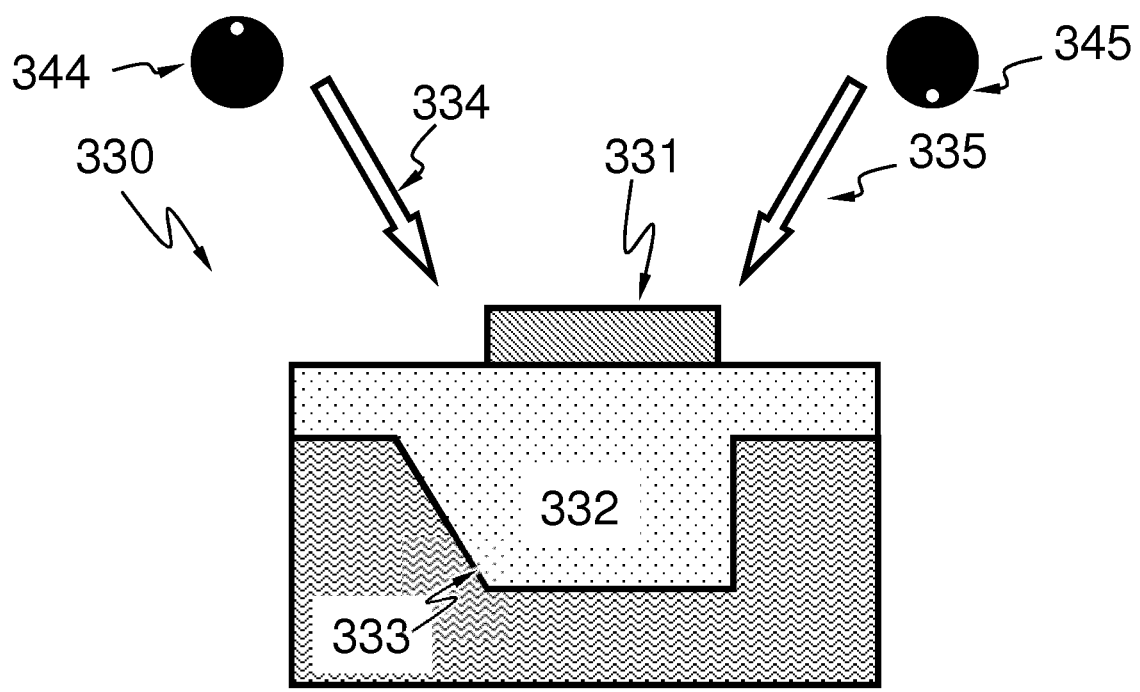

FIG. 4C schematically shows a cross-sectional view of the stack of another metrology target 330 formed according to a nominal metrology target design represented by a metrology target measurement recipe. The metrology target 330 includes an upper structure 331 over a trench 332. As shown in FIG. 4C, the metrology target 330 is substantially different from the metrology target 310. For example, the sidewall 333 of the trench 332 is tilted (not perpendicular to the object) because of the process (e.g., etch, CMP, or one or more other steps in the process). This indicates that the metrology target 330 has a low degree of printability given the specific patterning process in FIG. 4C. As a result, the metrology target measurement recipe that represents the metrology target 330 should perhaps be discarded. Otherwise, a metrology data may be unreliable and inaccurate if the metrology target measurement recipe is used. For example, two otherwise identical metrology target measurement recipes that use radiation beams 334 and 335 at the same incidence angle for metrology target measurement, except that the radiation beams 334 and 335 are directed from different directions (i.e., different azimuth angles) onto the object. The radiation beams 334 and 335 may be generated by using aperture plates 344 and 345 respectively at the pupil plane (e.g., the aperture plate 13 is in FIG. 2A). Although the beams 334 and 335 have the same angle of incidence relative to the object, the beam 334 glances off the sidewall 333 while the beam 335 is almost normal to the sidewall 333. The beam 334 thus is barely scattered by the sidewall 333 but the beam 335 is strongly scattered by the sidewall 333. Therefore, characteristics of the scattering of the beams 334 and 335 by the target are different and a systematic error caused by the tilted sidewall 333 is different for metrology target measurement recipes respectively using the beams 334 and 335.

Figure 5:
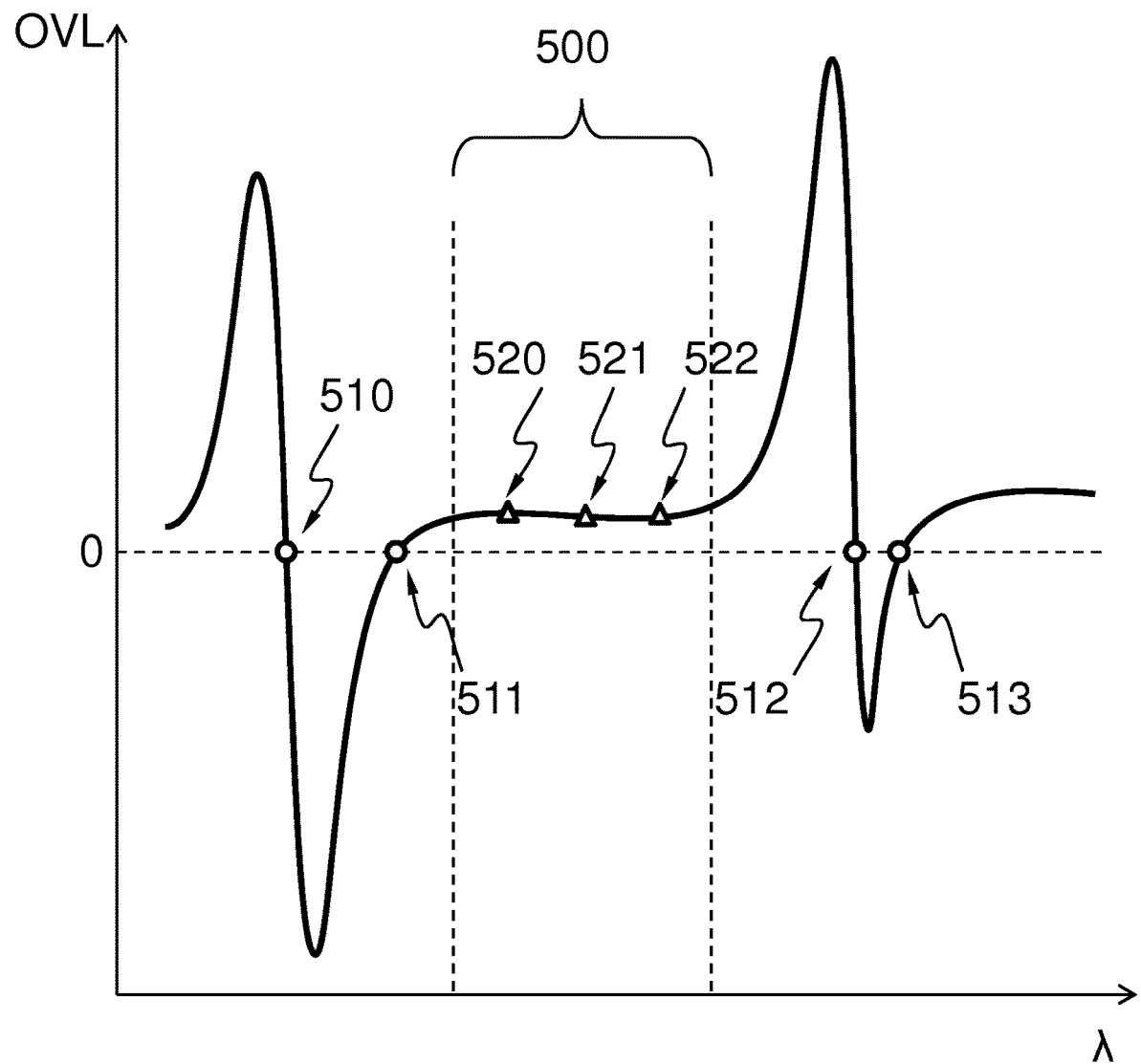
FIG. 5 shows an example of an error (vertical axis) of a result of a metrology target measurement recipe as a function of a parameter (horizontal axis) of the metrology target measurement recipe.
Figure 6:
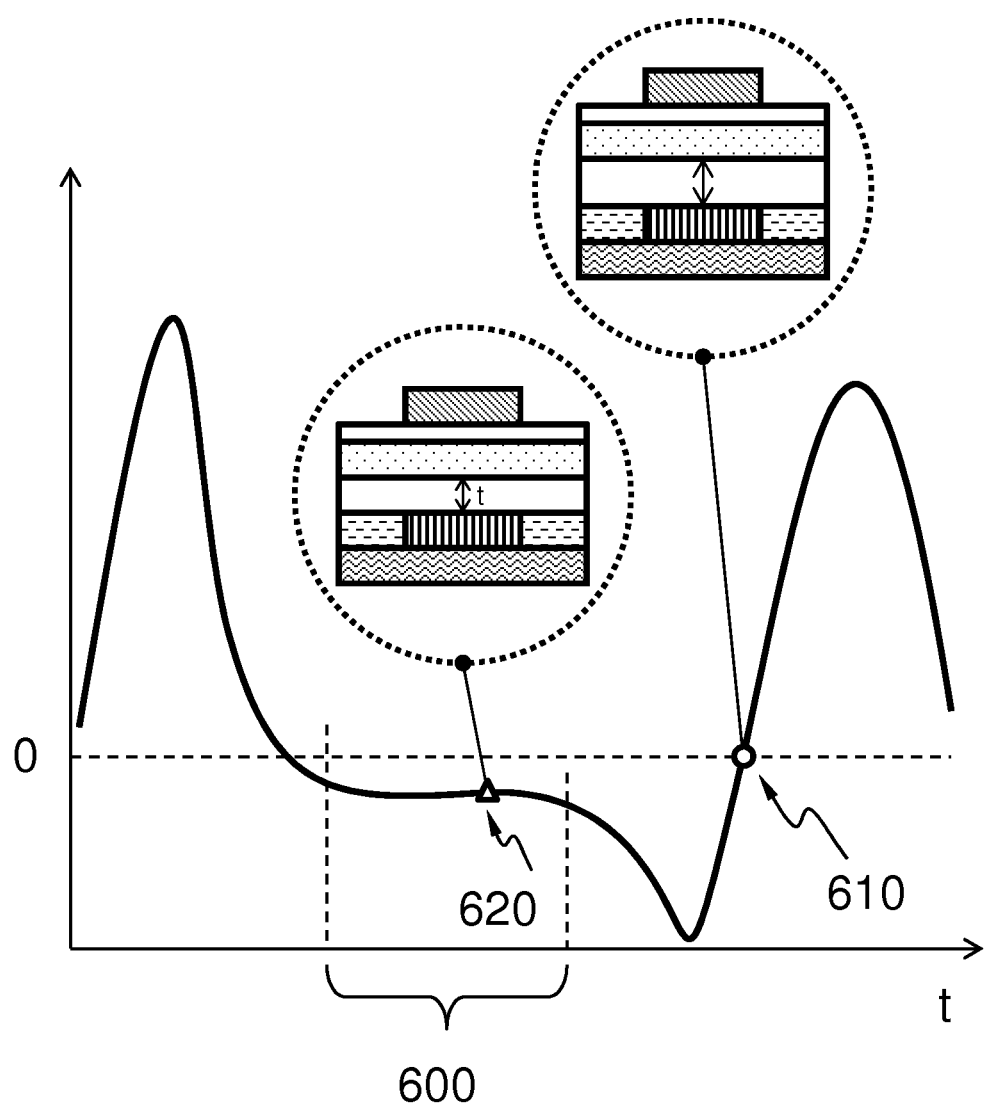
FIG. 6 shows an example of an error (vertical axis) of a result of a metrology target measurement recipe as a function of a parameter (horizontal axis) of the metrology target measurement recipe.
Figure 7:
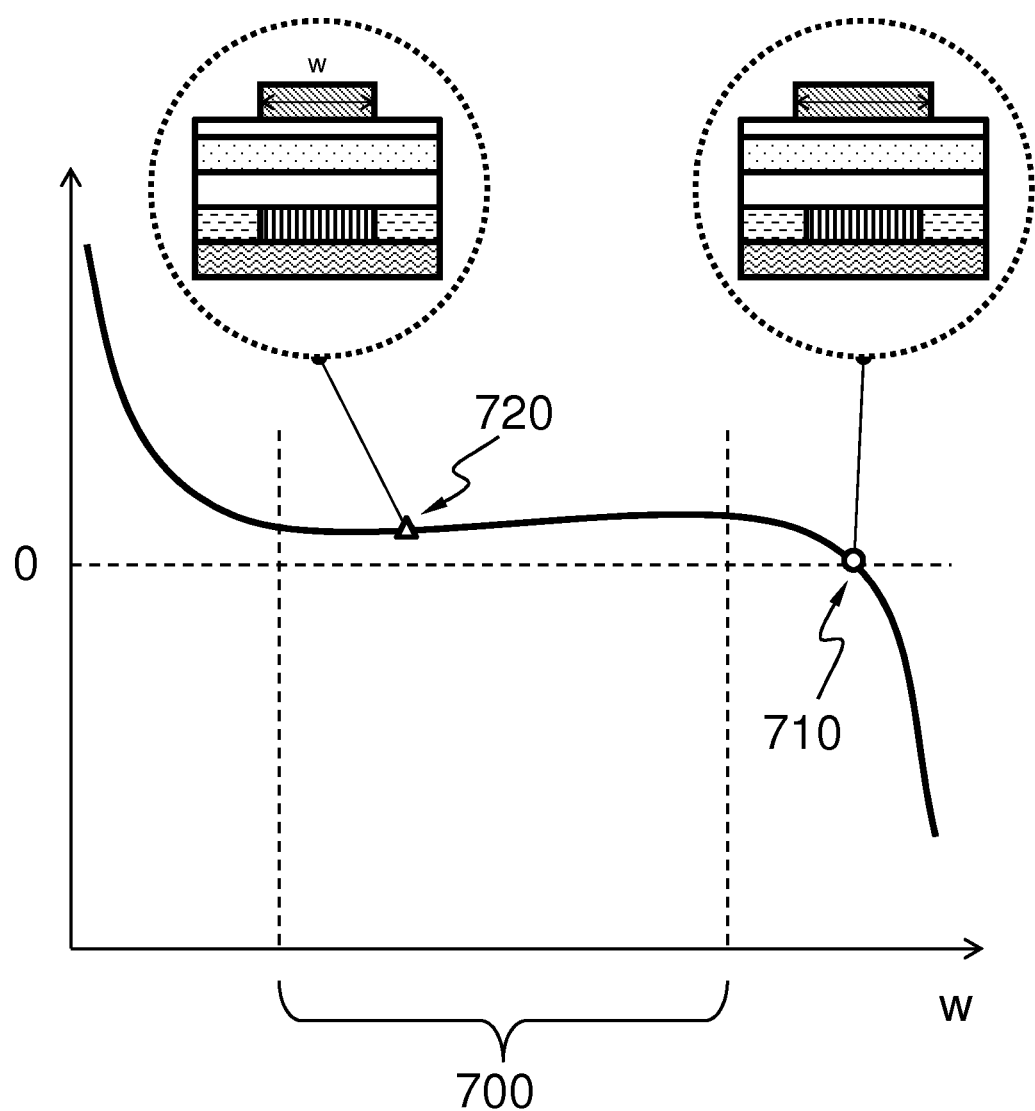
FIG. 7 shows an example of an error (vertical axis) of a result of a metrology target measurement recipe as a function of a parameter (horizontal axis) of the metrology target measurement recipe.

FIGS. 5-7 illustrate three examples of metrology target measurement recipes that result in robustness of measurement with respect to one of the parameters of metrology target measurement recipes. Although there is only one variable parameter shown in FIGS. 5-7, there might be two or more variable parameters as described above.

FIG. 5 shows an example of an error (vertical axis) of result determined using a metrology target measurement recipe as a function of a parameter (horizontal axis) of the metrology target measurement recipe. In this particular example, the result is overlay and the parameter is wavelength of the radiation used in the metrology target measurement recipe. At the several wavelength values marked by the circles 510-513, the error of the result is zero— namely the metrology target measurement recipes with these wavelength values are accurate. At the wavelength values marked by the triangles 520-522, the errors are small but not zero—namely the metrology target measurement recipes with these wavelength values are almost accurate but not entirely accurate. However, the metrology target measurement recipes with the wavelength values marked by the triangles 520-522 may still be better than the metrology target measurement recipes with the wavelength values marked by the circles 510-513. This is because a small amount of perturbation of the wavelength does not cause a large change of the error of the results of the metrology target measurement recipes with the wavelength values marked by the triangles 520-522, but would cause a large change of the error of the results of the metrology target measurement recipes with the wavelength values marked by the circles 510-513. Accordingly, the derivatives of the errors determined using the metrology target measurement recipes with respect to the wavelength values marked by the triangles 520-522 are much smaller than the derivatives of the errors determined using the metrology target measurement recipes with respect to the wavelength values marked by the circles 510-513. As such, the metrology target measurement recipes 520-522 results in a relatively high degree of robustness of measurement. However, the metrology target measurement recipes 510-513 result in a relatively low degree of robustness of measurement.

FIG. 6 shows another example of an error (vertical axis) of a result measured using a metrology target measurement recipe as a function of a parameter (horizontal axis) of the metrology target measurement recipe. The parameter may be a characteristic of the stack of layers of the target in the metrology target measurement recipe. In this particular example, the parameter is a thickness t of a layer in the stack of the target. The metrology target measurement recipe with a value of t marked by the triangle 620 has a small but non-zero error in the result; the metrology target measurement recipe with a value oft marked by the circle 610 has zero error in the result. However, the measurement recipe corresponding to point 620 is a better metrology target measurement recipe than the measurement recipe corresponding to circle 610 because the measurement recipe corresponding to triangle 620 is more robust to perturbation of thickness t than the measurement recipe corresponding to circle 610. Specifically, a small amount of perturbation of the thickness does not cause a large change of the error of the result of the metrology target measurement recipe marked by the triangle 620, but would cause a large change of the error measured using the metrology target measurement recipe marked by the circle 610. Accordingly, the derivative of the error measured using the metrology target measurement recipe marked by the triangle 620 with respect to the thickness at triangle 620 is much smaller than the derivative of the error measured using the metrology target measurement recipe marked by the circle 610 with respect to the thickness at circle 610. As such, the metrology target measurement recipe marked by the triangle 620 results in a high degree of robustness of measurement. However, the metrology target measurement recipe marked by the circle 610 results in a low degree of robustness of measurement.

FIG. 7 shows another example of an error (vertical axis) of a result of a metrology target measurement recipe as a function of a parameter (horizontal axis) of the metrology target measurement recipe. The parameter may be a characteristic of the shape of the nominal metrology target design in the metrology target measurement recipe. In this particular example, the parameter is a width w of at least part (e.g., a feature of a periodic structure) of the nominal metrology target design. The metrology target measurement recipe with a value of w marked by the triangle 720 has a small but non-zero error in the result; the metrology target measurement recipe with a value of w marked by the circle 710 has zero error in the result. However, the measurement recipe corresponding to point 720 is a better metrology target measurement recipe than the measurement recipe corresponding to circle 710 because the measurement recipe corresponding to triangle 720 is more robust to perturbation of width w than the measurement recipe corresponding to circle 710. Specifically, a small amount of perturbation of the width does not cause a large change of the error of the result of the metrology target measurement recipe marked by the triangle 720, but would cause a large change of the error measured using the metrology target measurement recipe marked by the circle 710. Accordingly, the derivative of the error measured using the metrology target measurement recipe marked by the triangle 720 with respect to the width at triangle 720 is much smaller than the derivative of the error measured using the metrology target measurement recipe marked by the circle 710 with respect to the width at circle 710. As such, the metrology target measurement recipe marked by the triangle 720 results in a high degree of robustness of measurement. However, the metrology target measurement recipe marked by the circle 710 results in a low degree of robustness of measurement.

A range of a parameter of metrology target measurement recipes may be determined from the relationship between the error of the results of the metrology target measurement recipes and the parameter, under the condition that the other parameters of the metrology target measurement recipes have a set of values. The word "range" herein does not imply continuity (i.e., a range may include sub-ranges not connected to one another). For example, the range may be that within which the absolute values of the error are below a threshold or the magnitude of variations of the error is below a threshold. Examples of such a range include the ranges 500, 600 and 700 in FIG. 5, FIG. 6 and FIG. 7, respectively. Metrology target measurement recipes with the parameter whose value is within the range are both nearly accurate and relatively insensitive to (i.e., robust with respect to) variation of the parameter, under the condition that the other parameters of the metrology target measurement recipes have a set of values. When the other parameters change from one set of values to another set, the range may also change. Namely, a range of a parameter may be found for each set of values of the other parameters. The metrology target measurement recipes with the parameter whose value is within the intersection of the ranges for a number of sets of values of the other parameters are both nearly accurate and relatively insensitive to (i.e., robust with respect to) variation of the parameter, under the condition that the other parameters of the metrology target measurement recipes have any of these sets of values. The intersection may be further reduced to those values of the parameter that satisfy a constraint imposed on the metrology target measurement recipes.

As described above, the metrology data and/or a characteristic of a feature of a functional device may include overlay error, alignment, or CD. The types of metrology data and/or characteristics of a feature of a functional device are by no means limited to these. Other examples may include characteristics of an image plane image of the metrology target or feature of a functional device or characteristics of a pupil plane image of the metrology target or feature of a functional device.

Figure 8:
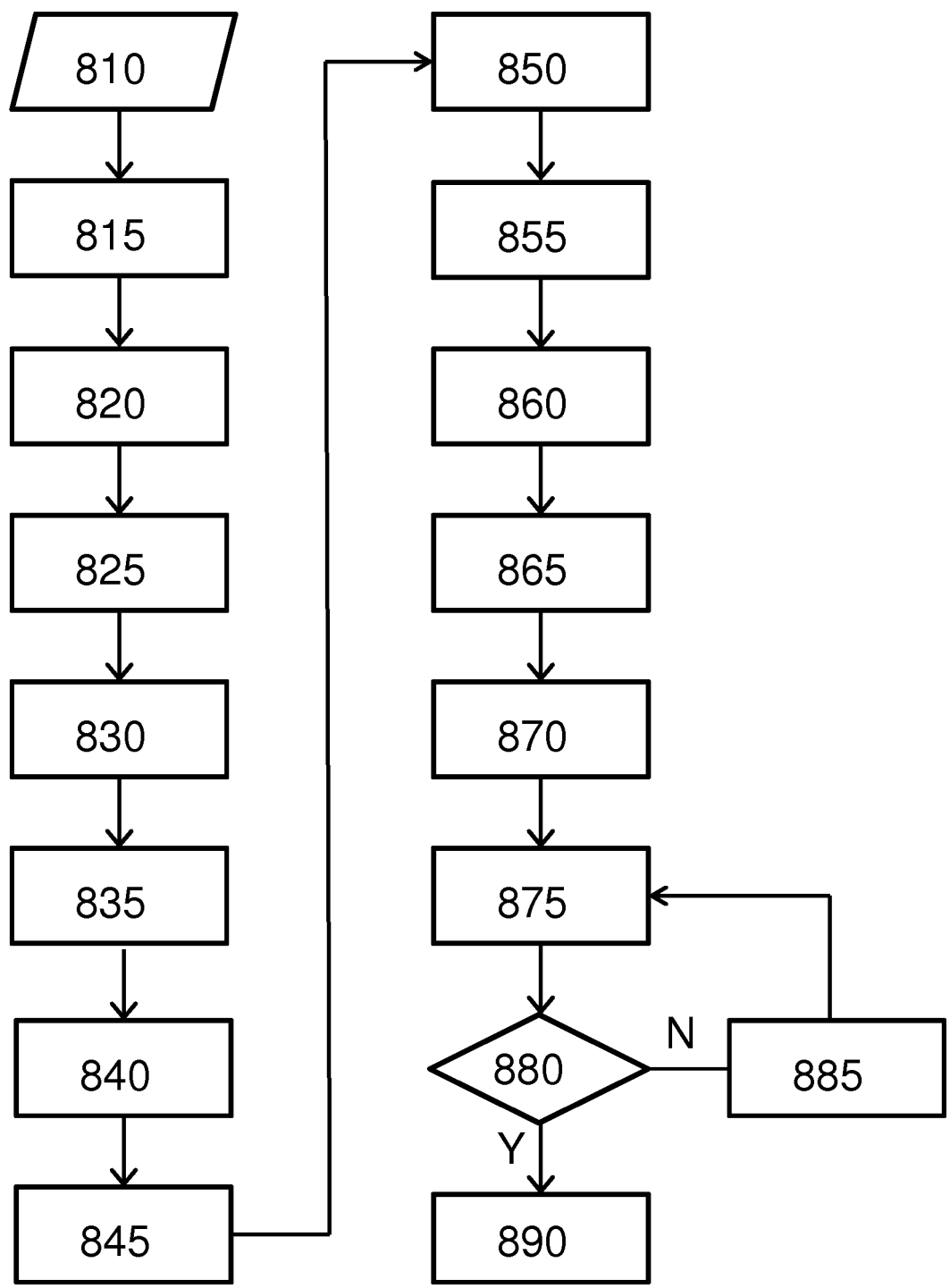
FIG. 8 schematically shows a flow for a method of selecting metrology target measurement recipes.

FIG. 8 schematically shows an example flow for a method of selecting metrology target measurement recipes. Selecting a metrology target measurement recipe is the same as selecting the values of one or more of the parameters of the metrology target measurement recipe. Because a metrology target measurement recipe may include one or more parameters of the nominal metrology target design, one or more parameters of the measurement itself, or both, selecting a metrology target measurement recipe may include selecting the values of the one or more parameters of the nominal metrology target design, the one or more parameters of the measurement itself, or both.

The method starts with a plurality of metrology target measurement recipes 810. In an embodiment, the metrology target measurement recipes 810 span a large range of the one of more parameters of the measurement itself and/or of the one or more parameters of the one or more nominal metrology target designs. Thus, in an embodiment, there are 5,000 or more metrology target measurement recipes, 10,000 or more metrology target measurement recipes, 20,000 or more metrology target measurement recipes, 50,000 or more metrology target measurement recipes, or 100,000 or metrology target measurement recipes.

At step 815, an optional initial filtering is performed on the plurality of metrology target measurement recipes 810 by examining one or more parameters of the metrology target measurement recipes. In particular, one or more design rules can be applied to one or more of the parameters of the metrology target measurement recipes to eliminate one or more of the metrology target measurement recipes. For example, the metrology target measurement recipes may include a critical dimension of the nominal metrology target designs. An applicable patterning technology may not accurately produce features with a critical dimension below a certain value (e.g., 5 nm or 10 nm) or a patterning device cannot be produced with features having a critical dimension below a certain value. As a result, one or more applicable design rules (e.g., whether a metrology target design feature is below a threshold value (e.g., less than 5 or 10 nm)) can be checked for each of the metrology target measurement recipes in order to remove those metrology target measurement recipes that fail (or pass) the applicable design rule(s).

At step 820, one or more first simulations are performed for each of the remaining metrology target measurement recipes using a first mathematical model. As noted above, each of the metrology target measurement recipes can represent a different metrology target design, or represent a different measurement recipe, or both.

In an embodiment, the first model may simulate patterning of a metrology target design for a metrology target measurement recipe onto an object using a patterning process defined by an acceptable range of one or more processing parameters, to produce a simulated first metrology target design (e.g., using a resist model and illumination model). The acceptable range of processing parameters may be one or more certain values for each of the processing parameters related to the patterning process. For example, the one or more processing parameters may include dose, focus, etch rate, etc. The simulated first metrology target design may be used for a first printability check as described in step 825.

In an embodiment, the first model simulates one or more first signals detected by a detector of a metrology tool for a metrology target design for a metrology target measurement recipe. The first model may simulate the measuring using the metrology tool using a measuring process defined by an acceptable range of one or more measuring parameters (e.g., of which one or more measuring parameters may be represented in the metrology target measurement recipe). The acceptable range of measuring parameters may be one or more certain values for each of the measuring parameters related to the measuring process. For example, the one or more measuring parameters may include polarization of a measurement radiation beam, wavelength of a measurement radiation beam, etc. In an embodiment, each of the one or more first signals is a result of interaction between a measurement beam and the metrology target design (e.g., the simulated first metrology target design described above). In an embodiment, the first model simulates first metrology data based on the one or more simulated first signals detected by the detector of the metrology tool. The first metrology data may include, but is not limited to, overlay error, alignment, and/or critical dimension data. The simulated one or more first signals and/or simulated first metrology data may be used for a first detectability check as described in step 830 and/or for a first robustness check as described in step 835.

In an embodiment, the first model may further simulate a feature of a functional device based on the acceptable range of values for the processing parameters as described above. The values of a first characteristic of the feature may be determined subsequently. The first characteristic may include, but is not limited to, overlay error, alignment, and/or critical dimension data of the feature. The simulated first characteristic along with the simulated first metrology data may be compared for a first similarity check as described in step 840.

In an embodiment, the first model can be used such that the one or more processing and/or measuring parameters as applicable have their values perturbed (e.g., up to 1%, up to 2%, up to 5%, etc.) from their respective nominal values to determine sensitivity of a result (e.g., the simulated one or more first signals and/or simulated first metrology data and/or simulated first characteristics) from the simulation to the perturbation. Thus, this type of simulation can be used to enable the first robustness check as described in step 835.

As discussed further below, a second mathematical model is used to perform further simulations in relation to remaining metrology target measurement recipes. In an embodiment, the second model is different than the first model; it can be different in respect of mathematical functions used, number or types of mathematical terms of mathematical functions used, parameters used, parameter values used, etc. In an embodiment, the effect is that the first model is less accurate than the second model. In an embodiment, the effect is that the first model is faster than the second model. In an embodiment, the first and second models model the same process and/or apparatus but the results of the first model are more of an approximation than the results of the second model. So, in an embodiment, by using the first model, while a simulation accuracy may be compromised relative to the second model, the time for simulation using the first model is reduced compared to the second model. This is desirable, for example, when the number of remaining metrology target measurement recipes is large (e.g., at step 810). Thus, there may be provided a "fast" metrology target measurement recipe evaluation mode in relation to steps 810-845 and an "accurate" metrology target measurement recipe evaluation mode in relation to steps 850-875.

For example, the second model may include all the spatial frequency components of the source pupil. The second model may also include all the spatial frequency components of the nominal metrology target designs represented by the metrology target measurement recipes. Since the second model is more accurate than the first model, the simulated second metrology target design is expected to be more accurate than the first metrology targets.

In an embodiment, the difference between the first and second models can be implemented in various ways. In an embodiment, the pupil of an optical metrology tool or of a lithographic apparatus used to make a metrology target or functional device may be complex. Accordingly, the complex pupil may be decomposed into a plurality of spatial frequency components. The simulation time associated with the pupil may be a function of the number of spatial frequency components of the pupil. Accordingly, the first model may include more of an approximation of the pupil, e.g., by removing one or more high spatial frequency components of the complex pupil compared to the second model or otherwise available for the first model. This is done so that the simulation using the first model would be much faster but having a lower degree of accuracy than could be otherwise provided. Similarly, the number of harmonics evaluated of a mathematical transform used in an electromagnetic solver of the model can be reduced in the first model compared to the second model or otherwise available for the first model; for example, higher harmonics can be eliminated from evaluation in the first model compared to the second model. In an embodiment, sparse sampling can be used for the first model relative to the second model or otherwise available for the first model. For example, the pixels evaluated (e.g., of the pupil) for the first model can be sparse sampled relative to the second model (e.g., 1 in 10 pixels, 1 in 20 pixels, 1 in 25 pixels, 1 in 50 pixels, etc. can be evaluated in the first model compared to the second model). In an embodiment, a different size of pixel can be used for the first model relative to the second model or otherwise available for the first model. For example, larger pixels can be used for the first model relative to the second model.

Using the one or more first simulations (step 820) performed for the remaining metrology target measurement recipes, the method may proceed to one or more of steps 825-840 subsequently or in parallel for further selection of one or more metrology target measurement recipes subject to a respective selection rule. So, in an embodiment, just one of the steps 825-840 may be implemented. In an embodiment, two of the steps 825-840 may be implemented. In an embodiment, three or more of the steps 825-840 may be implemented. When two or more of the steps 825-840 are implemented, the order of implementing the two or more steps may be arbitrary (e.g., different than as presented herein).

Figure 9:
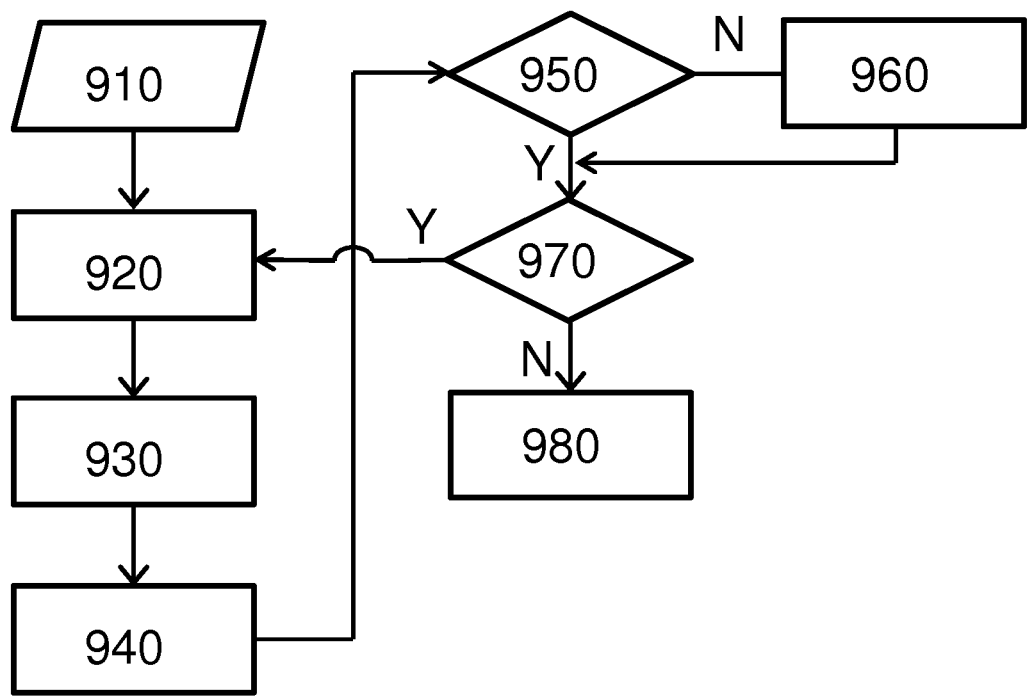
FIG. 9 schematically shows a flow for a method of performing a printability check.

At step 825, a first printability check is performed for a remaining metrology target measurement recipe. The first printability check may determine, by evaluation against a threshold, whether the metrology target measurement recipe under consideration results in a relatively high degree of printability of the nominal metrology target design for the metrology target measurement recipe under consideration or a relatively low degree of printability of the nominal metrology target design for the metrology target measurement recipe under consideration. The one or more metrology target measurement recipes that have a high degree of printability may be selected and kept for further selection, while one or more metrology target measurement recipes that have a low degree of printability may be removed from further consideration. More details of step 825 are illustrated in FIG. 9.

Figure 10:
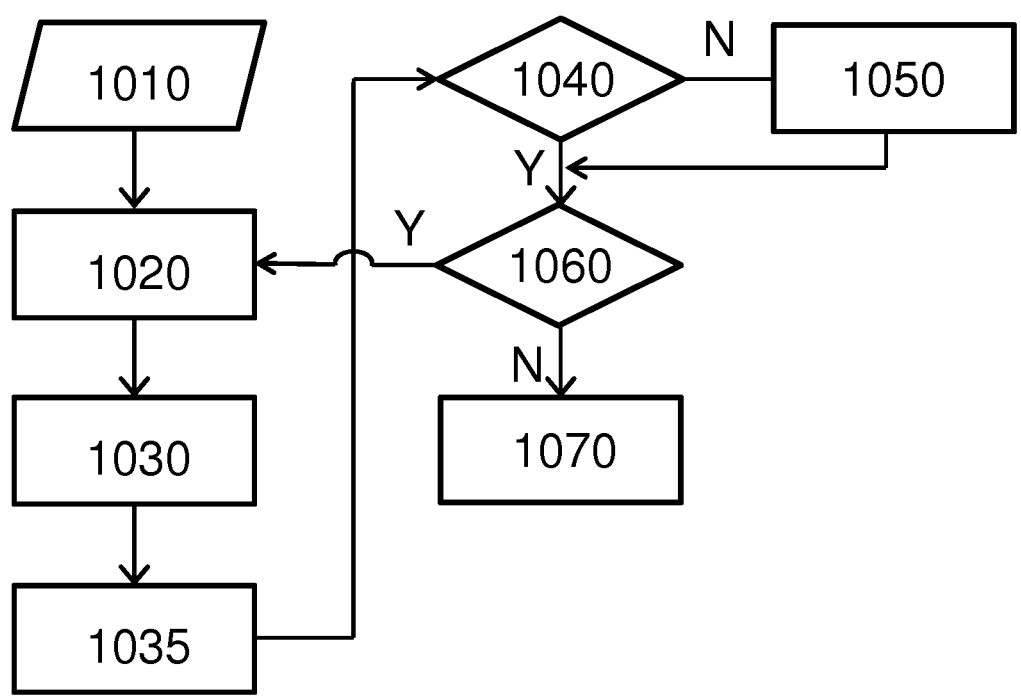
FIG. 10 schematically shows a flow for a method of performing a detectability check.

At step 830, a first detectability check is performed for a remaining metrology target measurement recipe. The first detectability check may determine, by evaluation against a threshold, whether the metrology target measurement recipe under consideration results in a relatively high degree of detectability or a relatively low degree of detectability of radiation redirected by the nominal metrology target design for the metrology target measurement recipe under consideration and detected by a detector of a metrology tool. The one or more metrology target measurement recipes that result in a high degree of detectability may be selected and kept for further selection, while the one or more metrology target measurement recipes that result in a low degree of detectability may be removed from further consideration. More details of step 830 are illustrated in FIG. 10.

Figure 11:
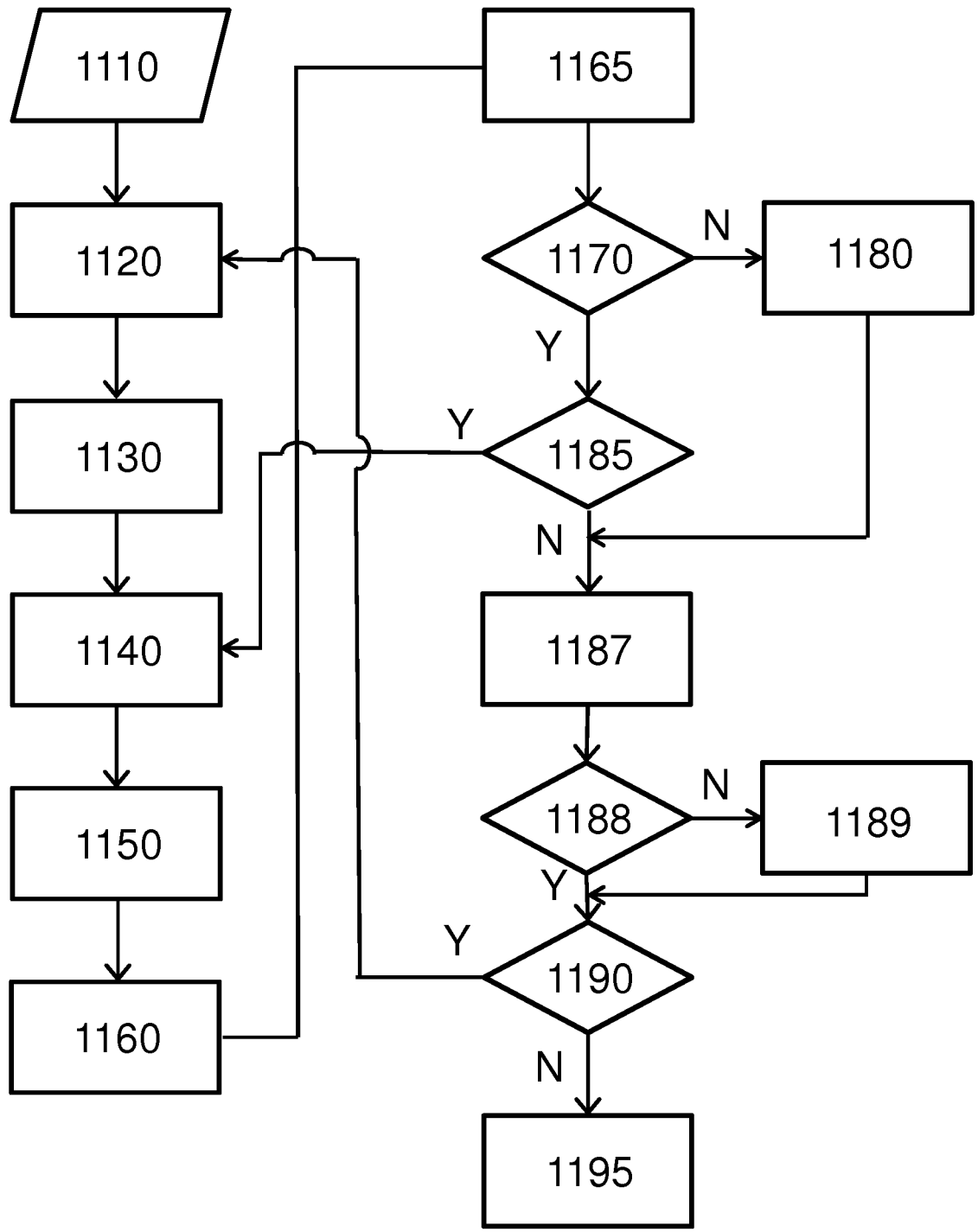
FIG. 11 schematically shows a flow for a method of performing a robustness check.

At step 835, a first robustness check is performed for a remaining metrology target measurement recipe. The robustness check may determine, by evaluation against a threshold, whether a metrology target measurement recipe under consideration results in a relatively high degree of robustness or a relatively low degree of robustness of measurement of the nominal metrology target design for the metrology target measurement recipe under consideration, when patterned on the object. The one or more metrology target measurement recipes that result in a high degree of robustness may be selected and kept for further selection, while one or more metrology target measurement recipes that result in a low degree of robustness may be removed from further consideration. More details of step 835 are illustrated in FIG. 11.

Figure 12:
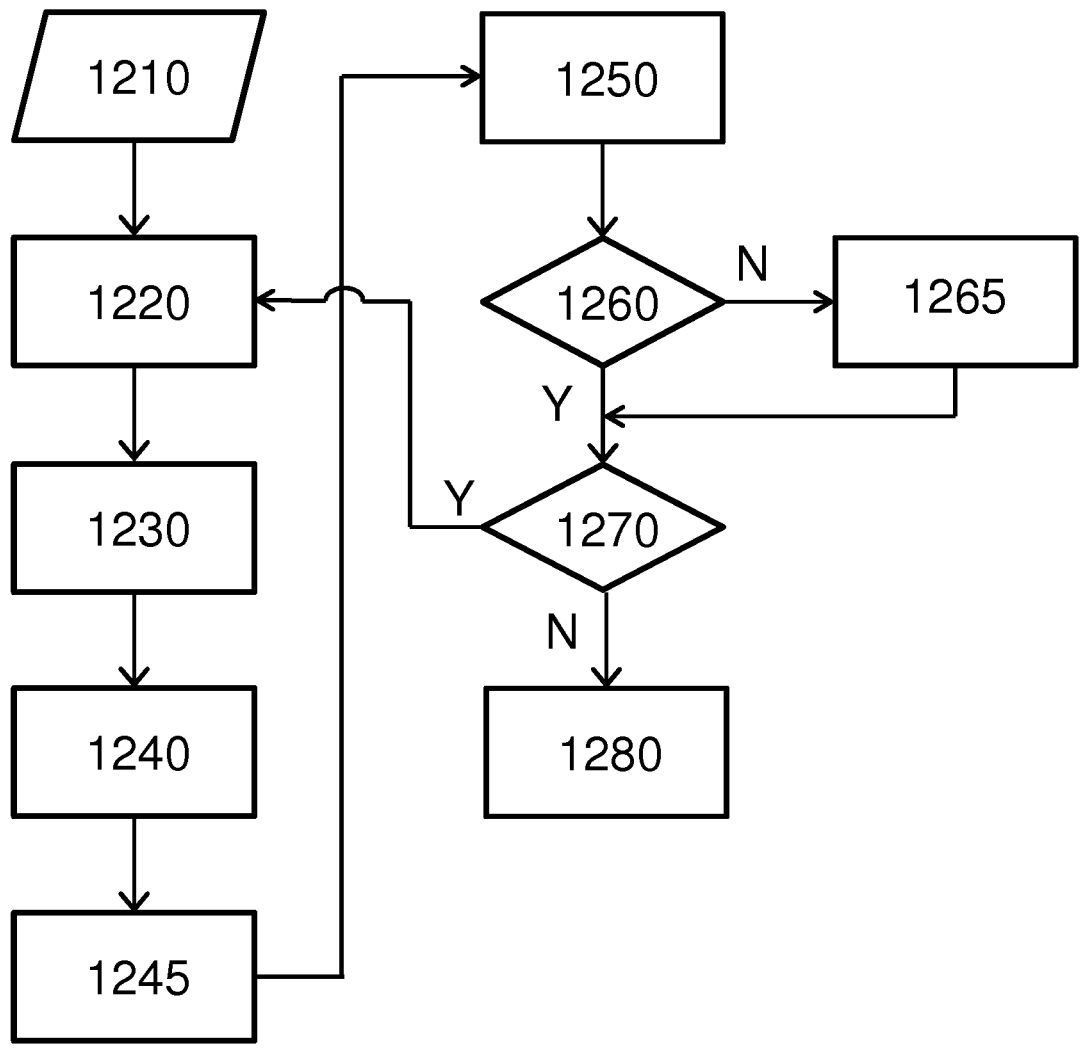
FIG. 12 schematically shows a flow for a method of performing a device similarity check.

At step 840, a first similarity check is performed for a remaining metrology target measurement recipe. The first similarity check may determine, by evaluation against a threshold, whether results of a metrology target measurement recipe under consideration has a relatively high degree of similarity to results for a feature of a functional device or a relatively low degree of similarity to results for the feature of the functional device. The one or more metrology target measurement recipes that provide a high degree of similarity in results to a feature of a functional device may be selected and kept for further selection, while one or more metrology target measurement recipes that provide a low degree of similarity in results to a feature of a functional device may be removed from further consideration. More details of step 840 are illustrated in FIG. 12.

Figure 13:
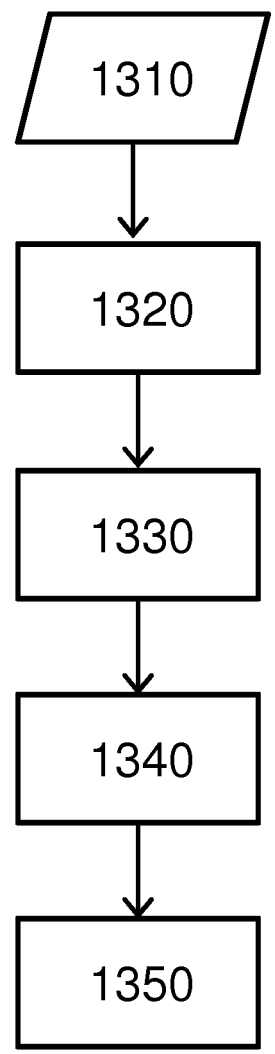
FIG. 13 schematically shows a flow for a method of performing a diversity check.

At step 845, a first diversity check is performed for the remaining metrology target measurement recipes as a whole. The first diversity check may be used to help ensure that the selected metrology target measurement recipes at step 845 have diverse values for one or more specific parameters. For example, the metrology target measurement recipes may include a parameter indicative of the geometry of the nominal metrology target designs. Different values of the parameter may indicate different geometries of the nominal metrology target designs, e.g., different pitches of a periodic structure of the nominal metrology target design, or different ranges of pitches of the nominal metrology target designs, etc. Thus, in this example, the diversity check may be used to help ensure that the selected metrology target measurement recipes after the diversity check have a plurality of different geometries of the nominal metrology target designs. In this example, the one or more specific parameters include a parameter indicative of the geometry of the nominal metrology target design. It should be appreciated that the one or more specific parameters may include one or more other parameters related to the nominal metrology target designs, the measurement itself, or both. More details of step 845 are illustrated in FIG. 13.

As described above, the method may perform one or more of steps 825-840. In some examples, the first diversity check (step 845) may be performed before or after any of the one or more steps of 825-840. Further, the method may perform more than one first diversity check (step 845).

In an embodiment, the method performs a first detectability check (step 830), a first robustness check (step 835) and a first diversity check (step 845) using data from simulation using the first model. In an embodiment, the first detectability check (step 830) is performed then a first robustness check (step 835) and then a first diversity check (step 845).

At step 850, one or more second simulations are performed based on each of the remaining metrology target measurement recipes using a second model. As discussed above, the second model is different than the first model. In an embodiment, the second model is more accurate, etc. than the first model. The result is that the processing by steps 825-845 is more selective, e.g., yielding fewer metrology target measurement recipes or yielding more representative (e.g., accurate) metrology target measurement recipes. The differences between the first and second model are described earlier in more detail.

In an embodiment, the second model may simulate patterning of a metrology target design for a metrology target measurement recipe onto an object using a patterning process defined by an acceptable range of one or more processing parameters, to produce a simulated second metrology target design. The acceptable range of processing parameters may be one or more certain values for each of the processing parameters related to the patterning process. For example, the one or more processing parameters may include dose, focus, etch rate, etc. The simulated second metrology target design may be used for a second printability check as described in step 855.

In an embodiment, the second model simulates one or more second signals detected by a detector of a metrology tool for a metrology target design for a metrology target measurement recipe. The second model may simulate the measuring using the metrology tool using a measuring process defined by an acceptable range of one or more measuring parameters (e.g., of which one or more measuring parameters may be represented in the metrology target measurement recipe). The acceptable range of measuring parameters may be one or more certain values for each of the measuring parameters related to the measuring process. For example, the one or more measuring parameters may include polarization of a measurement radiation beam, wavelength of a measurement radiation beam, etc. In an embodiment, each of the one or more second signals is a result of interaction between a measurement beam and the metrology target design (e.g., the simulated second metrology target design described above). In an embodiment, the second model simulates second metrology data based on the one or more simulated second signals detected by the detector of the metrology tool. The second metrology data may include, but is not limited to, overlay error, alignment, and/or critical dimension data. The simulated one or more second signals and/or simulated second metrology data may be used for a second detectability check as described in step 860 and/or for a second robustness check as described in step 865.

In an embodiment, the second model may further simulate a feature of a functional device based on the acceptable range of values for the processing parameters as described above. The values of a second characteristic of the feature may be determined subsequently. The second characteristic may include, but is not limited to, overlay error, alignment, and/or critical dimension data of the feature. The simulated second characteristic along with the simulated second metrology data may be compared for a second similarity check as described in step 870.

In an embodiment, the second model can be used such that the one or more processing and/or measuring parameters as applicable have their values perturbed (e.g., up to 1%, up to 2%, up to 5%, etc.) from their respective nominal values to determine sensitivity of a result (e.g., the simulated one or more second signals and/or simulated second metrology data and/or simulated second characteristics) from the simulation to the perturbation. Thus, this type of simulation can be used to enable the second robustness check as described in step 865.

Using the data from the one or more second simulations (step 850) performed for the remaining metrology target measurement recipes, the method proceeds to perform one or more of steps 855-875 subsequently or in parallel for further selection of one or more metrology target measurement recipes subject to a respective selection rule. The steps 855-875 include a second printability check (step 855), a second detectability check (step 860), a second robustness check (step 865), a second similarity check (step 870) and/or a diversity check (step 875). The steps 850-875 are similar to the steps 825-845 and as described in FIGS. 9-12.

In an embodiment, just one of the steps 855-870 may be implemented. In an embodiment, two of the steps 855-875 may be implemented. In an embodiment, three or more of the steps 855-875 may be implemented. When two or more of the steps 855-875 are implemented, the order of implementing the two or more steps may be arbitrary (e.g., different than as presented herein).

In an embodiment, the method performs each of steps 855-875. In an embodiment, the method performs the second detectability check (step 860) and the second robustness check (step 865) using data from simulation using the second model. Then, a second printability check (step 855) and a second similarity check (step 870) are performed using data from simulation using the second model, optionally in conjunction with a second diversity check (step 875).

In some examples, the second diversity check (step 875) may be performed before or after any of the one or more steps of 855-870. Further, the method may perform more than one second diversity check (step 875).

In an embodiment, the respective selection rule(s) of the second printability check, the second detectability check, the second robustness check, and/or the second similarity check is more restrictive than the respective first printability check, the first detectability check, the first robustness check, and/or the first similarity check as described in FIGS. 9-12.

At step 880, it is determined whether a number of the remaining metrology target measurement recipes reaches a certain threshold. If so, the method proceeds to step 890. Otherwise, the method proceeds to step 885.

At step 885, the method may return to any of steps 825-845 or steps 855-875 while relaxing the selection rule of the returned step (while FIG. 8 shows returning to step 875, the method may return any one or more of steps 825-845 or steps 855-875). Accordingly, for example, one or more selected from: the first printability threshold, the second printability threshold, the first detectability threshold, the second detectability threshold, the first robustness threshold, the second robustness threshold, the first similarity threshold, the second similarity threshold, the first certain number for the first diversity check, and/or the second certain number for the second diversity check as described in FIGS. 9-13 is adjusted (e.g., increased or decreased as appropriate) to enable selection of more metrology target measurement recipes. Thus, when the method returns to step 880, the number of remaining metrology target measurement recipes is increased. By example in FIG. 8, the method returns to step 875 while increasing the number of metrology target measurement recipes to be selected corresponding to each value (i.e., the second certain number as described in FIG. 13) of the specific one or more parameters of the metrology target measurement recipes. As described above, the method may return to one or more other above-mentioned steps in another example.

At step 890, the remaining metrology target measurement recipes are output to a user (e.g., a human or metrology system). In some examples, a group of nominal metrology target designs represented by the remaining metrology target measurement recipes are selected (e.g., automatically or by a user) and made available to a user.

According to an embodiment, a metrology target measurement apparatus includes a storage configured to store a plurality of metrology target measurement recipes, and a processor configured to select one or more metrology target measurement recipes from the plurality of metrology target measurement recipes according to a method described herein. In an embodiment, a metrology target measurement apparatus is configured to receive one or more parameters of a selected metrology target measurement recipe according to a method described herein. In an embodiment, a metrology target measurement apparatus is used to measure a metrology target design from a metrology target measurement recipe of the plurality of metrology target measurement recipes and/or measurement a metrology target design according to a measurement parameter from a metrology target measurement recipe from the plurality of metrology target measurement recipes.

Accordingly, in an embodiment, a method is provided that speeds up design of a metrology target measurement recipe (e.g., one or more parameters of a metrology target design, one or more parameters a metrology measurement using a metrology target, etc.) by having a first mode involving a less accurate or faster simulation and/or using one or more less restrictive selection criteria and having a second mode involving a more accurate or slower simulation and/or using one or more selection criteria that are more restrictive. Thus, in an embodiment, a relatively loose simulation setting (first mode) is used at first for evaluating a plurality of metrology target measurement recipes and the results are filtered with selection criteria. In an embodiment, the first mode uses sparse pixel sampling and/or lower electromagnetic solver harmonics. In an embodiment, one or more criteria used in the first mode are looser than the second mode so that metrology target measurement recipes that may be good in the second mode while bad in the first mode can also survive.

After the first mode, verification is performed in the second mode with, e.g., more accurate simulation settings and/or tighter criteria. By doing so, false metrology target measurement recipes that are just good in the first mode are de-selected and the surviving metrology target measurement recipes are selected based on more accurate simulation settings and/or tighter criteria. With this multiple mode method, a faster filtering that can scan a larger solution space with acceptable grid can be achieved in a reasonable time (~1 week).

In an embodiment, an integrated flow is provided such that most, if not all, set-up and judgment are automatically performed as part of the method. In an embodiment, functionality blocks (such as the various checks described above) can be customized. A user can tune the parameters in the block or build a customized flow with these blocks. A default flow can be provided. As long as the input is ready, the flow can parse the input and provide a final selected metrology target measurement recipe (e.g., a metrology target design). As a scan of a whole solution space is possible, the whole solution space is predefined with an acceptable grid as a default template for input to the method. For example, with a default metrology target measurement recipe and default work flow, a user could just add patterning process specific information (e.g., the nature of the layers into which a metrology target would be provided) and metrology target measurement recipe selection can be done automatically.

Thus, in an embodiment, the flow uses the first mode for a relatively large amount of metrology target measurement recipes, while the second mode is used for a relatively small amount of metrology target measurement recipes. In an embodiment, a design rule check is applied first to filter out metrology target measurement recipes that do not meet a design rule. Then, a simulation is performed for remaining metrology target measurement recipes according to first mode to select metrology target measurement recipes with, for example, good detectability. In an embodiment, remaining metrology target measurement recipes are evaluated with a simulation that is used to perturb one or more parameters to consider accuracy and robustness of the remaining metrology target measurement recipes. After the first mode, in an embodiment, remaining metrology target measurement recipes are ranked and only top metrology target measurement recipes in each of a plurality of categories (e.g., a category comprising metrology target measurement recipes with a same type of segmentation of individual features of a periodic structure of the metrology target, a category of metrology target measurement recipes with a same pitch of features, etc.) are selected for providing to the second mode to help ensure a limited number and diversity at the same time. After selection of top metrology target measurement recipes in each category (e.g., categories representing different geometric parameters of a metrology target), a relatively small amount of good and diverse metrology target measurement recipes are evaluated using the second mode so that, e.g., the run time of the second mode is not too long. In the second mode, similar checks as performed in the first mode can be performed (e.g., detectability and/or robustness as described in the embodiment above) or a different or additional check can be performed (e.g., a printability check and/or a similarity check in the embodiment above).

In an embodiment, a dynamic filtering scheme is applied to help ensure enough metrology target measurement recipes are selected. For example, for some challenging cases, with certain given metrology target measurement recipe selection criteria, there may not be enough qualified metrology target measurement recipes. So when filtering the metrology target measurement recipes, a minimum number should be provided. If the number of metrology target measurement recipes is too few from a certain filtering, one or more of the criteria are loosened automatically so that enough metrology target measurement recipes can be passed toward the end of the process.

So, in an embodiment, this method can provide a quick and/or less accurate simulation with optionally relatively loose filtering with a more accurate and/or slower simulation with optionally relatively tighter filtering. In an embodiment, the method provides a faster overall process for selecting one or more metrology target measurement recipes. In an embodiment, the method can enable elimination of user judgment entirely or significantly. In an embodiment, a wider solution space can be scanned and so help avoid missing good metrology target measurement recipes. In an embodiment, the method is automated so as to eliminate variance due to user modification and/or reliance on user experience. In an embodiment, user time spent on metrology target measurement recipe selection is significantly reduced. In an embodiment, the overall time for metrology target measurement recipe selection is reduced since significant user judgment is removed. In an embodiment, the method can enable consistent selection by helping to eliminate user involvement and helping to eliminate user input which can vary from user to user.

While the discussion herein has discussed use of the techniques herein for inspection of device substrates, the techniques here are not so limited and may be applied in other fields that involve device manufacturing or to other objects than device substrates. For example, the techniques here could be applied to alignment marks for other various objects, including patterning devices, substrate tables, etc.

FIG. 9 schematically shows a flow for a method of performing a printability check. The method may be used to implement the first printability check at step 825 and/or the second printability check at step 855. The method starts with a group of metrology target measurement recipes 910. At step 920, a metrology target measurement recipe is obtained from the group of metrology target measurement recipes 910.

At step 930, a simulated metrology target design based on the metrology target measurement recipe is obtained. The simulated metrology target design may be the simulated first metrology target design obtained using the first model as described above at step 820. Alternatively, the simulated metrology target design may be the simulated second metrology target design obtained using the second model as described above at step 850.

At step 940, a printability indicator is determined. The printability indicator may be used to characterize the degree of printability of the nominal metrology target design represented by the metrology target measurement recipe. In an embodiment, the printability indicator may be indicative of the difference between the nominal metrology target design and the simulated metrology target design. For example, the printability indicator may be an absolute value of a difference between one or more geometric dimensions of the nominal metrology target design and of the simulated metrology target design. For example, the printability indicator may be a ratio of one or more geometric dimensions of the nominal metrology target design to that of the simulated metrology target design.

At step 950, it is determined whether the printability indicator meets or crosses (e.g., smaller than) a printability threshold. The printability threshold may be the first printability threshold used in the first printability check at step 825. Alternatively, the printability threshold may be the second printability threshold used in the second printability check at step 855. In an embodiment, the second printability threshold is different (e.g., smaller) than the first printability threshold such the printability needs to be higher for the second printability check at step 855 than the first printability check at step 825. If so, the method proceeds to step 970. Otherwise, the method proceeds to step 960, where the metrology target measurement recipe is removed from further consideration.

At step 970, it is determined whether there are any more unchecked metrology target measurement recipes. If so, the method returns to step 920. Otherwise, the method proceeds to step 980. At step 980, any remaining metrology target measurement recipes are outputted. For example, a certain selection from a ranking of remaining metrology target measurement recipes can be outputted (e.g., a top 10, top 50, top 100, top 500, top 1000, etc. overall metrology target measurement recipes or top 10, top 50, top 100, top 500, top 1000, etc. metrology target measurement recipes for different one or more parameters of the metrology target measurement recipes).

FIG. 10 schematically shows a flow for a method of performing a detectability check. The method may be used to implement the first detectability check at step 830 and/or the second detectability check at step 860. The method starts with a group of metrology target measurement recipes 1010. At step 1020, a metrology target measurement recipe is obtained from the group of metrology target measurement recipes 1010. At step 1030, simulated one or more signals and/or simulated metrology data of a metrology tool are obtained. The simulated one or more signals and/or simulated metrology data may be the simulated one or more first signals and/or simulated first metrology data as described above at step 820. Alternatively, the simulated one or more signals and/or simulated metrology data may be the simulated one or more second signals and/or simulated second metrology data as described above at step 850.

At step 1035, a detectability indicator is determined. The detectability indicator may be used to characterize the degree of detectability of the metrology target design by a detector of a metrology tool. In an embodiment, the detectability indicator may be a ratio of the strength or intensity of the radiation redirected by the metrology target design to a threshold. In an embodiment, the threshold can be different for first detectability check at step 830 than the second detectability check at step 860.

At step 1040, it is determined whether the detectability indicator meets or crosses (e.g., larger than) a detectability threshold. The detectability threshold may be the first detectability threshold used in the first detectability check at step 830. Alternatively, the detectability threshold may be the second detectability threshold used in the second detectability check at step 860. In an embodiment, the second detectability threshold is different (e.g., greater) than the first detectability threshold such the detectability needs to be higher for the second detectability check at step 860 than the first detectability check at step 830. If so, the method proceeds to step 1060. Otherwise, the method proceeds to step 1050, wherein the metrology target measurement recipe is removed from consideration.

At step 1060, it is determined whether there are any more unchecked metrology target measurement recipes. If so, the method returns to step 1020. Otherwise, the method proceeds to step 1070. At step 1070, any remaining metrology target measurement recipes are outputted.

FIG. 11 schematically shows a flow for a method of performing a robustness check. The method may be used to implement the first robustness check at step 835 and/or the second robustness check at step 865. The method starts with a group of metrology target measurement recipes 1110. At step 1120, a metrology target measurement recipe is obtained from the group of metrology target measurement recipes 1110. At step 1130, the metrology data simulated based on the metrology target measurement recipe is obtained. The metrology data may be the first metrology data as described above at step 820. Alternatively, the metrology data may be the second metrology data as described above at step 850.

At step 1140, a parameter of the metrology target measurement recipe is obtained. The parameter may be a parameter related to the nominal metrology target design or a parameter related to the measurement. At step 1150, a small offset is applied to the value of the parameter. The small offset may be a certain offset value or a percentage of the value of the parameter. At step 1160, new metrology data is simulated based in part on the adjusted value of the parameter. The new metrology data may be simulated using the first model for the first robustness check. Alternatively, the new metrology data may be simulated using the second model for the second robustness check.

At step 1165, a robustness parameter is determined with respect to the parameter of the metrology target measurement recipe. The robustness parameter may be used to characterize the sensitivity of the metrology data with respect to a variation of the parameter. In an embodiment, the robustness parameter may be a ratio of the difference between the new metrology data and the obtained metrology data at step 1130 to the small offset.

At step 1170, it may be determined whether the robustness parameter meets or crosses (e.g., smaller than) a robustness threshold. The robustness threshold may be a first robustness threshold used in the first robustness check at step 835. Alternatively, the robustness threshold may be a second robustness threshold used in the second robustness check at step 865. In an embodiment, the second robustness threshold is different (e.g., smaller) than the first robustness threshold such the robustness needs to be higher for the second robustness check at step 865 than the first robustness check at step 835. If so, the method proceeds to step 1185. Otherwise, the method proceeds to step 1180, where the metrology target measurement recipe is removed from consideration.

At step 1185, it is determined whether there are any more parameters of the metrology target measurement recipe. If so, the method returns to step 1140. Otherwise, the method proceeds to step 1187.

At step 1187, a robustness indicator for the metrology target measurement recipe may be determined. The robustness indicator for the metrology target measurement recipe may be used to characterize the overall sensitivities of the metrology data with respect to the one or more parameters of the metrology target measurement recipe. For example, when the metrology target measurement recipe comprises only one parameter, the robustness indicator for the metrology target measurement recipe may be the robustness parameter as determined at step 1165. Otherwise, the robustness indicator for the metrology target measurement recipe can be derived from the robustness parameters of a plurality of parameters of the metrology target measurement recipe. In an embodiment, the robustness indicator for the metrology target measurement recipe may be a weighted combination of the robustness parameters with respect to each of the parameters of the metrology target measurement recipe.

At step 1170, it may be determined whether the robustness indicator meets or crosses a robustness threshold. The robustness threshold may be a first robustness threshold used in the first robustness check at step 835. Alternatively, the robustness threshold may be a second robustness threshold used in the second robustness check at step 865. In an embodiment, the second robustness threshold is different (e.g., smaller) than the first robustness threshold such the robustness needs to be higher for the second robustness check at step 865 than the first robustness check at step 835. If so, the method proceeds to step 1190. Otherwise, the method proceeds to step 1189, where the metrology target measurement recipe is removed from consideration.

At step 1190, it is determined whether there are any more metrology target measurement recipes. If so, the method returns to step 1120. Otherwise, the method proceeds to step 1195, where any remaining metrology target measurement recipes are outputted. For example, a certain selection from a ranking of remaining metrology target measurement recipes can be outputted (e.g., a top 10, top 50, top 100, top 500, top 1000, etc. overall metrology target measurement recipes or top 10, top 50, top 100, top 500, top 1000, etc. metrology target measurement recipes for different one or more parameters of the metrology target measurement recipes).

FIG. 12 schematically shows a flow for a method of performing a device similarity check. The method may be used to implement the first similarity check at step 840 and/or the second similarity check at step 870. The method starts with a group of metrology target measurement recipes 1210. At step 1220, a metrology target measurement recipe is obtained from the group of metrology target measurement recipes 1210.

At step 1230, a simulated feature of a functional device is obtained. The simulated feature may be the simulated feature using the first model at step 820. Alternatively, the simulated feature may be the simulated feature using the second model at step 850.

At step 1240, a characteristic of the simulated feature is determined. The characteristic of the feature may include, but is not limited to the overlay error, alignment, or critical dimension of the simulated feature. At step 1245, simulated metrology data is obtained. The simulated metrology data may be the first simulated metrology data using the first model at step 820. Alternatively, the simulated metrology data may be the second simulated metrology data using the second model at step 850.

At step 1250, a similarity indicator is determined. The similarity indicator may be used to characterize the degree of similarity of results for the metrology target design to that of the feature of the functional device. In an embodiment, the similarity indicator may be indicative of a difference between a determined characteristic of the simulated feature of the functional device and the simulated metrology data. For example, the similarity indicator may be an absolute value of a difference between the determined characteristic of the simulated feature and the simulated metrology data. For another example, the simulated indicator may be a ratio of the determined characteristic of the simulated feature to the simulated metrology data.

At step 1260, it is determined whether the similarity indicator meets or crosses (e.g., is smaller than) a similarity threshold. The similarity threshold may be the first similarity threshold used in the first similarity check at step 840. Alternatively, the similarity threshold may be the second similarity threshold used in the second similarity check at step 870. In an embodiment, the second similarity threshold is different (e.g., smaller) than the first similarity threshold such the similarity needs to be higher for the second similarity check at step 870 than the first similarity check at step 840. If so, the method proceeds to step 1270. Otherwise, the method proceeds to step 1265, where the metrology target measurement recipe is removed from consideration.

At step 1270, it is determined whether there are any more unchecked metrology target measurement recipes. If so, the method returns to step 1220. Otherwise, the method proceeds to step 1280, where any remaining metrology target measurement recipes are outputted. For example, a certain selection from a ranking of remaining metrology target measurement recipes can be outputted (e.g., a top 10, top 50, top 100, top 500, top 1000, etc. overall metrology target measurement recipes or top 10, top 50, top 100, top 500, top 1000, etc. metrology target measurement recipes for different one or more parameters of the metrology target measurement recipes).

FIG. 13 schematically shows a flow for a method of performing a diversity check. The method may be used to implement the first diversity check at step 845 and/or the second diversity check at step 875. The method starts with a group of metrology target measurement recipes 1310. At step 1320, the group of metrology target measurement recipes 1310 is divided into a plurality of sections based on a specific one or more parameters of the metrology target measurement recipe. The one or more metrology target measurement recipes in the same group comprise the same value or range of values for one or more parameters of the metrology target measurement recipes. The one or more parameters of the metrology target measurement recipes may be one or more parameters related to the nominal metrology target design, one or more parameters related to the measurement, or both. For example, the specific one or more parameters may include a parameter indicative of the geometry of the nominal metrology target design (e.g., a pitch, a feature width, etc.). As a result, the group of metrology target measurement recipes may be divided into a plurality of sections based on the geometry of the nominal metrology target design represented by the parameter. For example, a first section may include one or more metrology target measurement recipes representing a nominal metrology target design with a particular pitch or a range of pitches. A second section may include one or more metrology target measurement recipes representing a different pitch or different range of pitches, and so on.

At step 1330, the one or more metrology target measurement recipes of each of the sections are ranked based on one or more indicators for the metrology target measurement recipes. The one or more indicators for the metrology target measurement recipes may include one or more selected from: the printability indicator, the detectability indicator, the robustness indicator, and/or the similarity indicator. In an embodiment, each metrology target measurement recipe may have a collective indicator, which is a function of a plurality of indicators selected from: the printability indicator, the detectability indicator, the robustness indicator, and/or the similarity indicator. The one or more metrology target measurement recipes of each of the sections may be ranked based on the collective indicator for each of the one or more metrology target measurement recipes in the same section. For example, the collective indicator may the root of the sum of squares of a plurality of indicators, a weighting of a plurality of indicators, etc.

At step 1340, a certain number (e.g., 5, 10, 20, 50, 100, 500, etc.) of metrology target measurement recipes are selected from each of the sections based on the ranking. The certain number may be the first certain value used in the first diversity check at step 845. Alternatively, the certain number may be the second certain value used in the second diversity check at step 875. In an embodiment, the second certain number is smaller than the first certain number. At step 1350, the selected metrology target measurement recipes are outputted.

In an embodiment, there is provided a method comprising: performing, by a hardware computer, a first simulation for each of a plurality of different metrology target measurement recipes using a first model; selecting a first group of metrology target measurement recipes from the plurality of metrology target measurement recipes, the first group of metrology target measurement recipes satisfying a first rule; performing, by the computer, a second simulation for each of the metrology target measurement recipes from the first group using a second model; and selecting a second group of metrology target measurement recipes from the first group, the second group of metrology target measurement recipes satisfying a second rule, the first model being less accurate or faster than the second model and/or the first rule being less restrictive than the second rule.

In an embodiment, the first model excludes one or more harmonics or spatial frequency components relative to the second model or otherwise available for the first model. In an embodiment, the first model has a difference in pixels evaluated relative to the second model or otherwise available for the first model. In an embodiment, the difference comprises sparse sampling of pixels or a change in size of pixels. In an embodiment, the first rule is less restrictive than the second rule. In an embodiment, the first and second rule is one or more selected from: a detectability threshold, a printability threshold, a robustness threshold, a similarity threshold, and/or a diversity threshold. In an embodiment, the performing the first simulation for each of the plurality of metrology target measurement recipes using the first model further comprises simulating a signal detected by a detector using the first model, the signal being a result of a simulated interaction between a radiation beam and a metrology target. In an embodiment, the method further comprises determining first metrology data based on the simulated signal. In an embodiment, the first metrology data comprises one or more selected from: an overlay error, an alignment, or a critical dimension. In an embodiment, the selecting the first group of metrology target measurement recipes from the plurality of metrology target measurement recipes comprises selecting at least a subgroup of metrology target measurement recipes from the plurality of metrology target measurement recipes, the simulated signal, or metrology data derived from the simulated signal, associated with the at least a subgroup of metrology target measurement recipes meets or crosses a first detectability threshold. In an embodiment, the performing the first simulation comprises applying a variability to a parameter to determine a variability of the simulated signal to the variation of the varied parameter and wherein the selecting the first group of metrology target measurement recipes from the plurality of metrology target measurement recipes comprises selecting at least a subgroup of metrology target measurement recipes from the plurality of metrology target measurement recipes, the variability of the simulated signal, or of metrology data derived from the simulated signal, associated with the at least a subgroup of metrology target measurement recipes meets or crosses a first robustness threshold.

In an embodiment, the performing the first simulation for each of the plurality of metrology target measurement recipes using the first model comprises simulating formation of a metrology target on an object using the first model based on a value for each of a plurality of processing parameters of a patterning process. In an embodiment, the selecting the first group of metrology target measurement recipes from the plurality of metrology target measurement recipes comprises selecting at least a subgroup of metrology target measurement recipes from the plurality of metrology target measurement recipes, a parameter of the simulated formed metrology target associated with the at least a subgroup of metrology target measurement recipes meets or crosses a first printability threshold. In an embodiment, the performing the first simulation for each of the plurality of metrology target measurement recipes using the first model comprises: simulating a structure of a functional device based on the value for each of a plurality of processing parameters; and determining a first characteristic value based on the simulated structure. In an embodiment, the selecting the first group of metrology target measurement recipes from the plurality of metrology target measurement recipes comprises selecting at least a subgroup of metrology target measurement recipes from the plurality of metrology target measurement recipes, a result of a comparison between metrology data of a metrology target and the first characteristic value associated with each of the at least a subgroup of metrology target measurement recipes meeting or crossing a first similarity threshold. In an embodiment, the selecting the first group of metrology target measurement recipes from the plurality of metrology target measurement recipes comprises: dividing at least a portion of the plurality of metrology target measurement recipes into a plurality of first sections, each of the plurality of first sections comprising one or more of the metrology target measurement recipes and being associated with a different parameter, the one or more metrology target measurement recipes in a same first section having a same value for the respective parameter, and each of the plurality of metrology target measurement recipes being associated with a first indicator; ranking the one or more metrology target measurement recipes in each of the plurality of first sections based on the first indicator associated with the one or more metrology target measurement recipes; and selecting a first certain number of metrology target measurement recipes from each of the plurality of first sections based on the ranking.

In an embodiment, the performing the second simulation for each of the plurality of metrology target measurement recipes from the first group using the second model further comprises simulating a signal detected by a detector using the second model, the signal being a result of a simulated interaction between a radiation beam and a metrology target. In an embodiment, the method further comprises determining second metrology data based on the simulated signal. In an embodiment, the second metrology data comprises one or more selected from: an overlay error, an alignment, or a critical dimension. In an embodiment, the selecting the second group of metrology target measurement recipes from the plurality of metrology target measurement recipes comprises selecting at least a subgroup of metrology target measurement recipes from the plurality of metrology target measurement recipes, the simulated signal, or metrology data derived from the simulated signal, associated with the at least a subgroup of metrology target measurement recipes meets or crosses a second detectability threshold. In an embodiment, the second detectability threshold is less restrictive than a first detectability threshold for evaluating the plurality of metrology target measurement recipes for inclusion in the first group.

In an embodiment, the performing the second simulation comprises applying a variability to a parameter to determine a variability of the simulated signal to the variation of the varied parameter and wherein the selecting the second group of metrology target measurement recipes from the plurality of metrology target measurement recipes of the first group comprises selecting at least a subgroup of metrology target measurement recipes from the plurality of metrology target measurement recipes of the first group, the variability of the simulated signal, or of metrology data derived from the simulated signal, associated with the at least a subgroup of metrology target measurement recipes meets or crosses a second robustness threshold. In an embodiment, the second robustness threshold is less restrictive than a first robustness threshold for evaluating the plurality of metrology target measurement recipes for inclusion in the first group. In an embodiment, the performing the second simulation for each of the plurality of metrology target measurement recipes of the first group using the second model comprises simulating formation of a metrology target on an object using the second model based on a value for each of a plurality of processing parameters of a patterning process. In an embodiment, the selecting the second group of metrology target measurement recipes from the plurality of metrology target measurement recipes from the first group comprises selecting at least a subgroup of metrology target measurement recipes from the plurality of metrology target measurement recipes of the first group, a parameter of the simulated formed metrology target associated with the at least a subgroup of metrology target measurement recipes of the first group meets or crosses a second printability threshold. In an embodiment, the second printability threshold is less restrictive than a first printability threshold for evaluating the plurality of metrology target measurement recipes for inclusion in the first group.

In an embodiment, the performing the second simulation for each of the plurality of metrology target measurement recipes of the first group using the second model comprises: simulating a structure of a functional device based on the value for each of a plurality of processing parameters; and determining a second characteristic value based on the simulated structure. In an embodiment, the selecting the second group of metrology target measurement recipes from the plurality of metrology target measurement recipes of the first group comprises selecting at least a subgroup of metrology target measurement recipes from the plurality of metrology target measurement recipes of the first group, a result of a comparison between metrology data of a metrology target and the second characteristic value associated with each of the at least a subgroup of metrology target measurement recipes of the first group meeting or crossing a second similarity threshold. In an embodiment, the second similarity threshold is less restrictive than a first similarity threshold for evaluating the plurality of metrology target measurement recipes for inclusion in the first group. In an embodiment, the selecting the second group of metrology target measurement recipes from the plurality of metrology target measurement recipes of the first group comprises: dividing at least a portion of the plurality of metrology target measurement recipes of the first group into a plurality of second sections, each of the plurality of second sections comprising one or more of the metrology target measurement recipes from the first group and being associated with a different parameter, the one or more metrology target measurement recipes in a same second section having a same value for the respective parameter, and each of the plurality of metrology target measurement recipes being associated with a second indicator; ranking the one or more metrology target measurement recipes in each of the plurality of second sections based on the second indicator associated with the one or more metrology target measurement recipes; and selecting a second certain number of metrology target measurement recipes from each of the plurality of second sections based on the ranking In an embodiment, the second certain number is smaller than a first certain number for selecting metrology target measurement recipes from each of a plurality of first sections based on a ranking In an embodiment, the method further comprises, when a number of the metrology target measurement recipes in the second group is below a certain threshold number, relaxing the first rule and/or the second rule until the number of the metrology target measurement recipes in the second group is equal to or greater than the certain threshold number. In an embodiment, the relaxing the first rule and/or second rule comprises changing one or more selected from: a detectability threshold, a printability threshold, a robustness threshold, a similarity threshold, and/or a diversity threshold. In an embodiment, the method further comprises selecting one or more nominal metrology target designs from the second group of metrology target measurement recipes. In an embodiment, the method further comprises measuring, using a metrology apparatus, the one or more selected nominal metrology target design according to a measurement parameter of an associated metrology target measurement recipe. In an embodiment, each of the plurality of metrology target measurement recipes comprises a first parameter related to a metrology target design. In an embodiment, the first parameter comprises one or more selected from: a shape of the metrology target design, an orientation of the metrology target design, a refractive index of a layer of the metrology target design, an extinction coefficient of a layer of the metrology target design, a length of the metrology target design, a width of a feature of the metrology target design, and/or a thickness of a layer of the metrology target design. In an embodiment, each of the plurality of metrology target measurement recipes comprises a second parameter related to a measurement of a metrology target formed on an object. In an embodiment, each of the plurality of metrology target measurement recipes is associated with a measurement radiation beam and the second parameter comprises one or more selected from: polarization of the radiation beam, a wavelength of the radiation beam, an illumination shape of the radiation beam, and/or an incident angle of the radiation beam relative to the metrology target.

Figure 14:
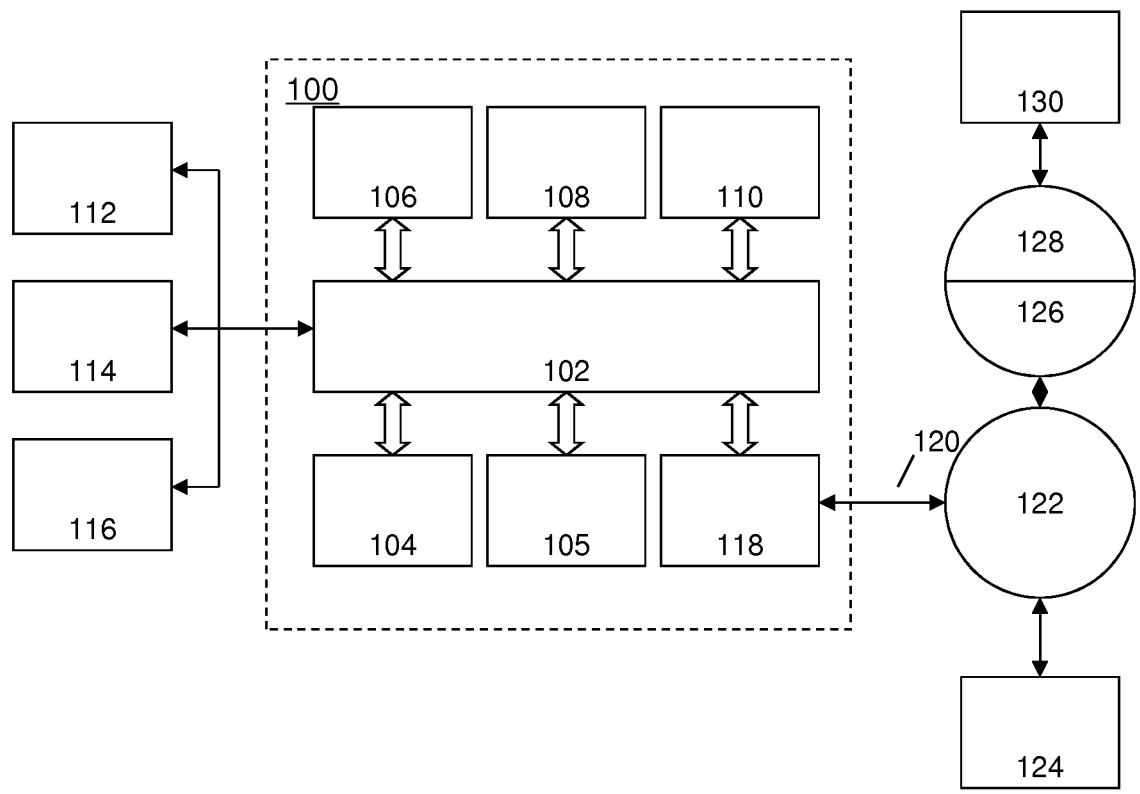
FIG. 14 is a block diagram of an example computer system.

FIG. 14 is a block diagram that illustrates a computer system 100 which can assist in implementing the methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store and/or supply information and instructions to be executed by processor 104. Main memory 106 may be used to store and/or supply temporary variables or other intermediate information during execution of instructions to be executed by processor 104. Computer system 100 may further include a read only memory (ROM) 108 or other static storage device coupled to bus 102 to store and/or supply static information and instructions for processor 104. A storage device 110, such as a magnetic disk or optical disk, may be provided and coupled to bus 102 to store and/or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, and/or stored in storage device 110, or other non-volatile storage for later execution. In this manner, computer system 100 may obtain application code in the form of a carrier wave.

Figure 15:
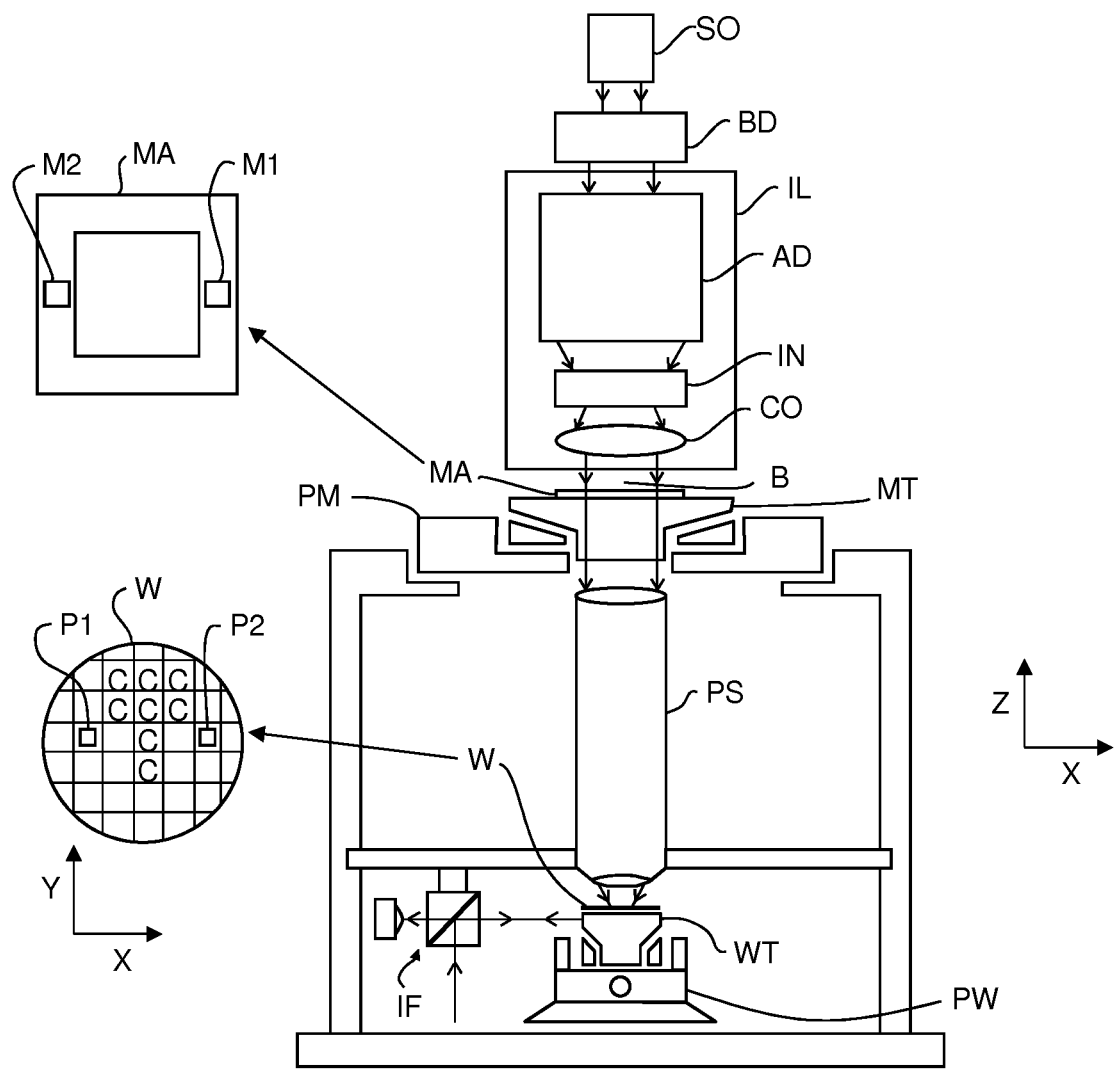
FIG. 15 is a schematic diagram of a lithographic apparatus.

FIG. 15 schematically depicts an exemplary lithographic apparatus. The apparatus comprises:

- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner PM to accurately position the patterning device with respect to item PS;
- a second object table (substrate table) WT provided with a substrate holder to hold a substrate W (e.g., a resist-coated silicon wafer), and connected to a second positioner PW to accurately position the substrate with respect to item PS;
- a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithographic apparatus (as is often the case when the source SO is a mercury lamp, for example), but that it may also be remote from the lithographic apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 16:
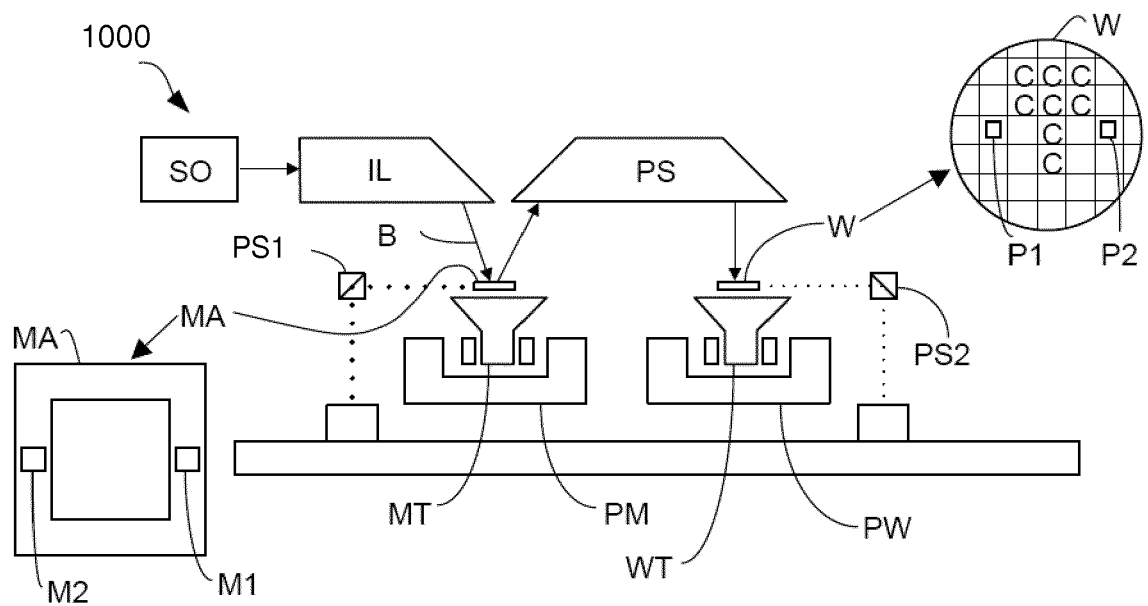
FIG. 16 is a schematic diagram of a lithographic apparatus.

FIG. 16 schematically depicts another exemplary lithographic apparatus 1000. The lithographic apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multi-layer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, and/or a substrate table and a table without a substrate). In such "multiple stage" devices the additional tables may be used in parallel, or preparatory steps may be carried out on one or more tables while one or more other tables are being used for exposures.

Twin stage lithographic apparatuses are described, for example, in U.S. Pat. No. 5,969,441, incorporated herein by reference in its entirety.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are known in the art for increasing the numerical aperture of projection systems. The term "immersion" as used herein does not mean that a structure, such as a substrate, must be submerged in liquid, but rather only means that liquid is located between the projection system and the substrate during exposure.

While the concepts disclosed herein may be used with device manufacturing on a substrate such as a silicon wafer, it shall be understood that the disclosed concepts may be used with any type of lithographic imaging systems, e.g., those used for imaging on substrates other than silicon wafers.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.
- a programmable LCD array.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic apparatus, no matter where the optical component is located on an optical path of the lithographic apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

The embodiments may further be described using the following clauses:

1. A method comprising:
   performing, by a hardware computer, a first simulation for each of a plurality of different metrology target measurement recipes using a first model;
   selecting a first group of metrology target measurement recipes from the plurality of metrology target measurement recipes, the first group of metrology target measurement recipes satisfying a first rule;
   performing, by the computer, a second simulation for each of the metrology target measurement recipes from the first group using a second model; and
   selecting a second group of metrology target measurement recipes from the first group, the second group of metrology target measurement recipes satisfying a second rule, the first model being less accurate or faster than the second model and/or the first rule being less restrictive than the second rule.
2. The method of clause 1, wherein the first model excludes one or more harmonics or spatial frequency components relative to the second model or otherwise available for the first model.
3. The method of clause 1 or clause 2, wherein the first model has a difference in pixels evaluated relative to the second model or otherwise available for the first model.
4. The method of clause 3, wherein the difference comprises sparse sampling of pixels or a change in size of pixels.
5. The method of any of clauses 1 to 4, wherein the first rule is less restrictive than the second rule.
6. The method of clause 5, wherein the first and second rule is one or more selected from: a detectability threshold, a printability threshold, a robustness threshold, a similarity threshold, and/or a diversity threshold.
7. The method of any of clauses 1 to 6, wherein the performing the first simulation for each of the plurality of metrology target measurement recipes using the first model further comprises simulating a signal detected by a detector using the first model, the signal being a result of a simulated interaction between a radiation beam and a metrology target.
8. The method of clause 7, further comprising determining first metrology data based on the simulated signal.
9. The method of clause 8, wherein the first metrology data comprises one or more selected from: an overlay error, an alignment, or a critical dimension.
10. The method of any of clauses 7 to 9, wherein the selecting the first group of metrology target measurement recipes from the plurality of metrology target measurement recipes comprises selecting at least a subgroup of metrology target measurement recipes from the plurality of metrology target measurement recipes, the simulated signal, or metrology data derived from the simulated signal, associated with the at least a subgroup of metrology target measurement recipes meets or crosses a first detectability threshold.
11. The method of any of clauses 7 to 10, wherein the performing the first simulation comprises applying a variability to a parameter to determine a variability of the simulated signal to the variation of the varied parameter and wherein the selecting the first group of metrology target measurement recipes from the plurality of metrology target measurement recipes comprises selecting at least a subgroup of metrology target measurement recipes from the plurality of metrology target measurement recipes, the variability of the simulated signal, or of metrology data derived from the simulated signal, associated with the at least a subgroup of metrology target measurement recipes meets or crosses a first robustness threshold.

12. The method of any of clauses 1 to 11, wherein the performing the first simulation for each of the plurality of metrology target measurement recipes using the first model comprises simulating formation of a metrology target on an object using the first model based on a value for each of a plurality of processing parameters of a patterning process.

13. The method of clause 12, wherein the selecting the first group of metrology target measurement recipes from the plurality of metrology target measurement recipes comprises selecting at least a subgroup of metrology target measurement recipes from the plurality of metrology target measurement recipes, a parameter of the simulated formed metrology target associated with the at least a subgroup of metrology target measurement recipes meets or crosses a first printability threshold.

14. The method of any of clauses 1 to 13, wherein the performing the first simulation for each of the plurality of metrology target measurement recipes using the first model comprises:
  simulating a structure of a functional device based on the value for each of a plurality of processing parameters; and
  determining a first characteristic value based on the simulated structure.

15. The method of clause 14, wherein the selecting the first group of metrology target measurement recipes from the plurality of metrology target measurement recipes comprises selecting at least a subgroup of metrology target measurement recipes from the plurality of metrology target measurement recipes, a result of a comparison between metrology data of a metrology target and the first characteristic value associated with each of the at least a subgroup of metrology target measurement recipes meeting or crossing a first similarity threshold.

16. The method of any of clauses 1 to 15, wherein the selecting the first group of metrology target measurement recipes from the plurality of metrology target measurement recipes comprises:
  dividing at least a portion of the plurality of metrology target measurement recipes into a plurality of first sections, each of the plurality of first sections comprising one or more of the metrology target measurement recipes and being associated with a different parameter, the one or more metrology target measurement recipes in a same first section having a same value for the respective parameter, and each of the plurality of metrology target measurement recipes being associated with a first indicator;
  ranking the one or more metrology target measurement recipes in each of the plurality of first sections based on the first indicator associated with the one or more metrology target measurement recipes; and
  selecting a first certain number of metrology target measurement recipes from each of the plurality of first sections based on the ranking.

17. The method of any of clauses 1 to 16, wherein the performing the second simulation for each of the plurality of metrology target measurement recipes from the first group using the second model further comprises simulating a signal detected by a detector using the second model, the signal being a result of a simulated interaction between a radiation beam and a metrology target.

18. The method of clause 17, further comprising determining second metrology data based on the simulated signal.

19. The method of clause 18, wherein the second metrology data comprises one or more selected from: an overlay error, an alignment, or a critical dimension.

20. The method of any of clauses 17 to 19, wherein the selecting the second group of metrology target measurement recipes from the plurality of metrology target measurement recipes comprises selecting at least a subgroup of metrology target measurement recipes from the plurality of metrology target measurement recipes, the simulated signal, or metrology data derived from the simulated signal, associated with the at least a subgroup of metrology target measurement recipes meets or crosses a second detectability threshold.

21. The method of clause 20, wherein the second detectability threshold is less restrictive than a first detectability threshold for evaluating the plurality of metrology target measurement recipes for inclusion in the first group.

22. The method of any of clauses 17 to 21, wherein the performing the second simulation comprises applying a variability to a parameter to determine a variability of the simulated signal to the variation of the varied parameter and wherein the selecting the second group of metrology target measurement recipes from the plurality of metrology target measurement recipes of the first group comprises selecting at least a subgroup of metrology target measurement recipes from the plurality of metrology target measurement recipes of the first group, the variability of the simulated signal, or of metrology data derived from the simulated signal, associated with the at least a subgroup of metrology target measurement recipes meets or crosses a second robustness threshold.

23. The method of clause 22, wherein the second robustness threshold is less restrictive than a first robustness threshold for evaluating the plurality of metrology target measurement recipes for inclusion in the first group.

24. The method of any of clauses 1 to 23, wherein the performing the second simulation for each of the plurality of metrology target measurement recipes of the first group using the second model comprises simulating formation of a metrology target on an object using the second model based on a value for each of a plurality of processing parameters of a patterning process.

25. The method of clause 24, wherein the selecting the second group of metrology target measurement recipes from the plurality of metrology target measurement recipes from the first group comprises selecting at least a subgroup of metrology target measurement recipes from the plurality of metrology target measurement recipes of the first group, a parameter of the simulated formed metrology target associated with the at least a subgroup of metrology target measurement recipes of the first group meets or crosses a second printability threshold.

26. The method of clause 25, wherein the second printability threshold is less restrictive than a first printability threshold for evaluating the plurality of metrology target measurement recipes for inclusion in the first group.

27. The method of any of clauses 1 to 26, wherein the performing the second simulation for each of the plurality of metrology target measurement recipes of the first group using the second model comprises:
  simulating a structure of a functional device based on the value for each of a plurality of processing parameters; and
  determining a second characteristic value based on the simulated structure.

28. The method of clause 27, wherein the selecting the second group of metrology target measurement recipes from the plurality of metrology target measurement recipes of the first group comprises selecting at least a subgroup of metrology target measurement recipes from the plurality of metrology target measurement recipes of the first group, a result of a comparison between metrology data of a metrology target and the second characteristic value associated with each of the at least a subgroup of metrology target measurement recipes of the first group meeting or crossing a second similarity threshold.

29. The method of clause 28, wherein the second similarity threshold is less restrictive than a first similarity threshold for evaluating the plurality of metrology target measurement recipes for inclusion in the first group.

30. The method of any of clauses 1 to 29, wherein the selecting the second group of metrology target measurement recipes from the plurality of metrology target measurement recipes of the first group comprises:

dividing at least a portion of the plurality of metrology target measurement recipes of the first group into a plurality of second sections, each of the plurality of second sections comprising one or more of the metrology target measurement recipes from the first group and being associated with a different parameter, the one or more metrology target measurement recipes in a same second section having a same value for the respective parameter, and each of the plurality of metrology target measurement recipes being associated with a second indicator;

ranking the one or more metrology target measurement recipes in each of the plurality of second sections based on the second indicator associated with the one or more metrology target measurement recipes; and selecting a second certain number of metrology target measurement recipes from each of the plurality of second sections based on the ranking.

31. The method of clause 30, wherein the second certain number is smaller than a first certain number for selecting metrology target measurement recipes from each of a plurality of first sections based on a ranking.

32. The method of any of clauses 1 to 31, further comprising when a number of the metrology target measurement recipes in the second group is below a certain threshold number, relaxing the first rule and/or the second rule until the number of the metrology target measurement recipes in the second group is equal to or greater than the certain threshold number.

33. The method of clause 32, wherein the relaxing the first rule and/or second rule comprises changing one or more selected from: a detectability threshold, a printability threshold, a robustness threshold, a similarity threshold, and/or a diversity threshold.

34. The method of any of clauses 1 to 33, further comprising selecting one or more nominal metrology target designs from the second group of metrology target measurement recipes.

35. The method of clause 34, further comprising measuring, using a metrology apparatus, the one or more selected nominal metrology target design according to a measurement parameter of an associated metrology target measurement recipe.

36. The method of any of clauses 1 to 35, wherein each of the plurality of metrology target measurement recipes comprises a first parameter related to a metrology target design.

37. The method of clause 36, wherein the first parameter comprises one or more selected from: a shape of the metrology target design, an orientation of the metrology target design, a refractive index of a layer of the metrology target design, an extinction coefficient of a layer of the metrology target design, a length of the metrology target design, a width of a feature of the metrology target design, and/or a thickness of a layer of the metrology target design.

38. The method of any of clauses 1 to 37, wherein each of the plurality of metrology target measurement recipes comprises a second parameter related to a measurement of a metrology target formed on an object.

39. The method of clause 38, wherein each of the plurality of metrology target measurement recipes is associated with a measurement radiation beam and the second parameter comprises one or more selected from: polarization of the radiation beam, a wavelength of the radiation beam, an illumination shape of the radiation beam, and/or an incident angle of the radiation beam relative to the metrology target.

40. A computer program product comprising a non-transitory computer readable medium having instructions recorded thereon, the instructions when executed by a computer implementing the method of any of clauses 1 to 39.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method comprising:
performing, by a hardware computer system, a first simulation for each of a plurality of different metrology target measurement recipes using a first model;
selecting a first group of one or more metrology target measurement recipes from the plurality of metrology target measurement recipes, the first group of one or more metrology target measurement recipes satisfying a first rule;

performing, by the computer system, a second simulation for each of the one or more metrology target measurement recipes from the first group using a second model;

selecting a second group of one or more metrology target measurement recipes from the first group, the second group of one or more metrology target measurement recipes satisfying a second rule; and outputting the second group of one or more metrology target measurement recipes, or data derived therefrom, for use in or with a physical measurement process of a physical metrology target, wherein the first model is less accurate or faster than the second model and/or wherein the first rule is less restrictive than the second rule.

2. The method of claim 1, wherein the first model excludes one or more harmonics or spatial frequency components relative to the second model or that are otherwise available for the first model.

3. The method of claim 1, wherein the first model has a difference in pixels evaluated relative to the second model or that are otherwise available for the first model.

4. The method of claim 3, wherein the difference comprises sparse sampling of pixels or a change in size of pixels.

5. The method of claim 1, wherein the performing the first simulation for each of the plurality of metrology target measurement recipes using the first model further comprises simulating a signal detected by a detector using the first model, the signal being a result of a simulated interaction between a radiation beam and a metrology target.

6. The method of claim 5, further comprising determining first metrology data based on the simulated signal.

7. The method of claim 5, wherein the selecting the first group of one or more metrology target measurement recipes from the plurality of metrology target measurement recipes comprises selecting at least a subgroup of one or more metrology target measurement recipes from the plurality of metrology target measurement recipes, wherein the simulated signal, or metrology data derived from the simulated signal, associated with the at least a subgroup of one or more metrology target measurement recipes meets or crosses a first detectability threshold.

8. The method of claim 5, wherein the performing the first simulation comprises applying a variability to a parameter to determine a variability of the simulated signal to the variation of the varied parameter and wherein the selecting the first group of one or more metrology target measurement recipes from the plurality of metrology target measurement recipes comprises selecting at least a subgroup of one or more metrology target measurement recipes from the plurality of metrology target measurement recipes, wherein the variability of the simulated signal, or of metrology data derived from the simulated signal, associated with the at least a subgroup of one or more metrology target measurement recipes meets or crosses a first robustness threshold.

9. The method of claim 1, wherein the performing the first simulation for each of the plurality of metrology target measurement recipes using the first model comprises simulating formation of a metrology target on an object using the first model based on a value for each of a plurality of processing parameters of a patterning process.

10. The method of claim 1, wherein the performing the first simulation for each of the plurality of metrology target measurement recipes using the first model comprises:

simulating a structure of a functional device based on the value for each of a plurality of processing parameters; and determining a first characteristic value based on the simulated structure.

11. The method of claim 1, wherein the selecting the first group of one or more metrology target measurement recipes from the plurality of metrology target measurement recipes comprises:

dividing at least a portion of the plurality of metrology target measurement recipes into a plurality of sections, each of the plurality of sections comprising one or more of the metrology target measurement recipes and being associated with a different parameter, the one or more metrology target measurement recipes in a same section having a same value for the respective parameter, and each of the plurality of metrology target measurement recipes being associated with a first indicator;

ranking the one or more metrology target measurement recipes in each of the plurality of sections based on the first indicator associated with the one or more metrology target measurement recipes; and selecting a first certain number of one or more metrology target measurement recipes from each of the plurality of sections based on the ranking.

12. The method of claim 1, wherein the performing the second simulation for each of the one or more metrology target measurement recipes from the first group using the second model further comprises simulating a signal detected by a detector using the second model, the signal being a result of a simulated interaction between a radiation beam and a metrology target.

13. The method of claim 1, wherein the performing the second simulation for each of the one or more metrology target measurement recipes of the first group using the second model comprises simulating formation of a metrology target on an object using the second model based on a value for each of a plurality of processing parameters of a patterning process.

14. The method of claim 1, wherein the first rule is less restrictive than the second rule.

15. The method of claim 14, wherein the first and second rule is one or more selected from: a detectability threshold, a printability threshold, a robustness threshold, a similarity threshold, and/or a diversity threshold.

16. A computer program product comprising a non-transitory computer readable medium having instructions recorded thereon, the instructions, when executed by a computer system, configured to cause the computer system to at least:

perform a first simulation for each of a plurality of different metrology target measurement recipes using a first model;

select a first group of one or more metrology target measurement recipes from the plurality of metrology target measurement recipes, the first group of one or more metrology target measurement recipes satisfying a first rule;

perform a second simulation for each of the one or more metrology target measurement recipes from the first group using a second model;

select a second group of one or more metrology target measurement recipes from the first group, the second group of one or more metrology target measurement recipes satisfying a second rule; and output the second group of metrology target measurement recipes, or data derived therefrom, for use in or with a physical measurement process of a physical metrology target, wherein the first model is less accurate or faster than the second model and/or wherein the first rule is less restrictive than the second rule.

17. The computer program product of claim 16, wherein the first model excludes one or more harmonics or spatial frequency components relative to the second model or that are otherwise available for the first model and/or the first model has a difference in pixels evaluated relative to the second model or that are otherwise available for the first model.

18. The computer program product of claim 16, wherein the first simulation comprises simulation of a signal detected by a detector using the first model, the signal being a result of a simulated interaction between a radiation beam and a metrology target and/or wherein the second simulation comprises simulation of a signal detected by a detector using the second model, the signal being a result of a simulated interaction between a radiation beam and a metrology target.

19. The computer program product of claim 16, wherein the first simulation comprises simulation of formation of a metrology target on an object using the first model based on a value for each of a plurality of processing parameters of a patterning process and/or wherein the second simulation comprises simulation of formation of a metrology target on an object using the second model based on a value for each of a plurality of processing parameters of a patterning process.

20. The computer program product of claim 16, wherein the instructions configured to cause the selection of the first group of one or more metrology target measurement recipes are further configured to cause at least:
  division of at least a portion of the plurality of metrology target measurement recipes into a plurality of sections, each of the plurality of sections comprising one or more of the metrology target measurement recipes and being associated with a different parameter, the one or more metrology target measurement recipes in a same section having a same value for the respective parameter, and each of the plurality of metrology target measurement recipes being associated with a first indicator;
  ranking of the one or more metrology target measurement recipes in each of the plurality of sections based on the first indicator associated with the one or more metrology target measurement recipes; and
  selection of a first certain number of one or more metrology target measurement recipes from each of the plurality of sections based on the ranking.

\* \* \* \* \*